United States Patent [19]

Sukegawa et al.

[11] Patent Number: 5,550,394
[45] Date of Patent: Aug. 27, 1996

[54] SEMICONDUCTOR MEMORY DEVICE AND DEFECTIVE MEMORY CELL CORRECTION CIRCUIT

[75] Inventors: Shunichi Sukegawa, Oume; Takumi Nasu, Tsuchiura; Hidetoshi Iwai, Oume, all of Japan

[73] Assignees: Texas Instruments Incorporated, Dallas, Tex.; Hitachi, Ltd., Japan

[21] Appl. No.: 80,159

[22] Filed: Jun. 18, 1993

[51] Int. Cl.[6] .................. H01L 31/0328; H01L 31/0336; H01L 31/072; H01L 31/109

[52] U.S. Cl. .................. 257/209; 257/529; 365/200; 371/10.2

[58] Field of Search .................. 257/209, 529; 365/200, 230.03; 371/10.2, 10.3

[56] References Cited

U.S. PATENT DOCUMENTS

| | | | |
|---|---|---|---|
| 4,989,181 | 1/1991 | Harada | 365/200 |
| 5,117,388 | 5/1992 | Nakano et al. | 365/73 |
| 5,122,987 | 6/1992 | Kihara | 365/200 |
| 5,179,536 | 1/1993 | Kasa et al. | 365/200 |

*Primary Examiner*—Sara W. Crane
*Attorney, Agent, or Firm*—William E. Hiller; Richard L. Donaldson

[57] ABSTRACT

To provide a semiconductor memory device characterized by the fact that it can prevent errors in the redundant memory address coincidence signal generating circuit caused by the intrinsic resistance of the fuse in the fuse decoder, and it has a redundant mechanism for generating the high-speed address coincidence signal. It has multiple logic gate means and fuses programmable by the gate output. The output signal of each fuse is wired to generate address coincidence signal.

6 Claims, 24 Drawing Sheets

|     | X1    | X4           |
|-----|-------|--------------|
|     |       | 1  EXTVEX_   |
|     |       | 2  VDD       |
|     |       | 3  VPERIM    |
|     |       | 4  2K/4K     |
|     |       | 5  A3        |
|     |       | 6  VDD       |
|     |       | 7  VSS       |
|     |       | 8  VSS       |
|     |       | 9  A4        |
|     |       | 10 A2        |
|     |       | 11 EXTBLR    |
|     |       | 12 A5        |
|     |       | 13 A1        |
|     |       | 14 VSS       |
|     |       | 15 AG        |
|     |       | 16 A0        |
|     |       | 17 VDD       |
|     |       | 18 VSS       |
|     |       | 19 A7        |
|     |       | 20 A10       |
|     |       | 21 A8        |
|     |       | 22 VSS       |
|     |       | 23 VDD       |
|     |       | 24 A11       |
|     | X1/X4 | 25 X1X4(NU)  |
|     |       | 26 A9        |
|     |       | 27 RAS_      |
|     |       | 28 VSS       |
|     |       | 29 VDD       |
|     | NU    | 30 G_        |
|     |       | 31 W_        |
|     |       | 32 VSS       |
|     |       | 33 CAS_      |
|     | NU    | 34 DQ1       |
|     | NU    | 35 DQ2       |
|     |       | 36 VSS       |
|     |       | 37 VDD       |
|     | D     | 38 NU        |
|     | NU    | 39 DG0       |
|     | Q     | 40 DQ3       |
|     |       | 41 VARYM     |
|     |       | 42 EXTVPLT   |
|     |       | 43 VSS       |
|     |       | 44 VSS       |
|     |       | 45 VBB       |

16MB CMOS DRAM

BONDING PAD

*Fig. 8*

W=X-1, X=0~11
BITB(-1)=CBRD

RFY=RAX*RAN 5,550,394

SEMICONDUCTOR MEMORY DEVICE AND DEFECTIVE MEMORY CELL CORRECTION CIRCUIT

This invention concerns a type of IC. More specifically, this invention concern type of IC device formed in a semiconductor substrate, such as dynamic random access memory or other memory device.

PRIOR ART

The rapid development of the dynamic random access memory DRAM as a type of large scale IC semiconductor device is well known, such as the development of the 16K DRAM disclosed by Lao in U.S. Pat. No. 4,055,444 to the 1M DRAM disclosed by McElroy in U.S. Pat. No. 4,658,377, and the 4M and 16M DRAM. At present, the 64M DRAM, which has more than 64 million memory cells and their associated circuitry formed on a single chip, is in the pilot manufacturing stage, and it is planned for mass production as the next generation DRAM. At present, the designers of the 64M DRAM ultra-large scale IC ULSI semiconductor memory device are facing many problems. For example, one concern is how to eliminate defective memory cells. As indicated by the planar capacitor cell disclosed in U.S. Pat. No. 4,240,092 by Kuo and the trench capacitor cell disclosed by Bagley et al. in U.S. Pat. No. 4,721,987, the development of the ultra-large scale DRAMs is promoted by the reduction in the memory cell geometry. For the 64M DRAM or for even a higher level of integration. The geometry is extremely small, and submicron technology (less than one-million of a matter) must be used for manufacturing. Consequently, the percentage of defective circuits and defective devices caused by particles, which were not formerly a serious problem in conventional manufacturing, will increase for such minute geometry.

With reference to FIG. 1, the conventional lithographic technology may be used to form electronic circuits on a semiconductor chip. On the surface of chip 10, there is a DRAM (dynamic random access memory) array 12 formed using the CMOS submicron technology disclosed by Texas Instruments Inc. in U.S. Pat. No. 5,017,506, dated May 21, 1991. For example, this DRAM circuit contains a 16 Mb dynamic random access memory. For memory array 12, the effective surface of semiconductor chip 10 is divided into four quadrants 12a–12d, each of which has 4Mb. Each of memory quadrants 12a–12d has sixteen 256K bits memory block 16. Each memory block 16 has 1,024 bit lines 17 (or columns), 1,024 sense amplifiers and 256 word lines 19 (or rows). Column decoder 18 is set along axial line 23 extending in the transverse direction of the chip and adjacent to each memory array quadrant. Row decoder 20 is set along axial line 25 extending in the longitudinal direction of the chip adjacent to each memory array quadrant. Peripheral circuit 22 containing input/output buffers as well as timing and control circuits is formed on the periphery of the substrate, and is set at the central position along the axial line extending in the transverse direction of the chip. On the other hand, bonding pad 24 is arranged at the central position along axial line 25 extending in the longitudinal direction of the chip.

FIG. 2 is a plan view showing a portion of the memory array 12. Memory cells of memory array 12 are of the improved trench type capacitor prepared using submicron technology. The memory cell has an area of about 4.8 $\mu m^2$, and is arranged between two word lines. Bit lines 17 are made of 3-layer polycide for improving the tolerance with respect to noise. Word lines 19 are made of polysilicon, and a word line is connected for every 64 bits. In the prior art, redundant circuitry is introduced for replacing the defective memory array. The redundant circuitry which is effective when there exists a defective memory cell in the rows and columns of the memory cells arranged in matrix form in the memory array is made of stand-by memory cells which can be used for replacing the defective memory array in units of rows or columns.

FIG. 3 is an oblique view illustrating a portion of memory array 12. FIG. 4 is its cross-sectional view. Mutual connection metal layer 41 is arranged in ribbon form. Oxide layer 47 is used to separate upper metal layer 42 from lower metal layer 49. Metal layer 49 is a multilevel interconnection metal 49 which acts as a connecting part for the bit lines. Oxide layer 51 is located beneath interconnection metal 49 and is used for separating silicide bit line 17 and metal layer 49. Interlayer insulating oxide layer 53 is located beneath bit line 17 but above word line 19a. Word line 19a forms the gate of transistor 43 through which the word line passes. Word lines 194, 196 pass over trench capacitors 44, 45, and are connected to the other trench capacitors, not shown in the figure. They are isolated from polysilicon field plate 48 by means of oxide layer 55. $N^+$-type diffusion portion 59 is formed beneath bit line contact point 15 and is formed in P-tank 60 between word line 19a and trench capacitor 44. Beneath field plate 48, there is a nitride layer 61 in the space region between trenches separated by trench capacitors 44, 45. There is an oxide layer 62 between nitride layer 61 and P tank 60. Trench capacitors 44, 45 penetrate into P-tank 60 and are located at the p-type substrate of silicon wafer 10. Arsenic layer 50 implanted on the outer side of the wall of the trench capacitor forms the $N^+$storage node. On the wall of the trench capacitor, layer 52 of oxide and nitride is located as a dielectric layer between the implanted arsenic portion on the trench wall and polysilicon field plate 48. Transistor 43 and trench capacitor 44 form memory cell 46. Defects of the memory cells may take place due to the large particles and crystalline defects on the bit line and word line associated with memory cell 46 as well as the gate oxide film of the transistor. In addition, as progress is being made in reducing the geometry, such as development of the 64M DRAM, etc., defective memory cells, short circuit between adjacent word lines, and problems of leakage of the interconnection lines of the first and second levels may take place by even small particles and crystalline defects.

FIG. 5 is an oblique view illustrating the state in which chip 10 is sealed by resin. In order to facilitate the explanation of the configuration, resin sealant 26 shown here is transparent. FIG. 6 shows the assembly method for this configuration. For chip 10, there are two strips of polyimide tape 32 beneath lead frame 30 for mounting chip 10 on lead frame 30. The resin sealed package has dimensions of about 400×725 mil. FIG. 7 is a cross-sectional view illustrating the assembled chip.

FIG. 8 shows the bonding pad assignment. Both sequences for options X1 and X4 are shown. EXT BLR is the pad used for the so-called in-house configuration used only in the manufacturing stage. FIG. 9 shows the configuration diagram of the X1 and X4 methods. With the aid of RAS__ and CAS__, CBR, CAR, static column mode, and other high-speed accessing methods are controlled. It is a 28-pin small outline J-lead type package (SOJ). For the bonding pads of the address signals, the mutual adjacent configuration is an ideal one to meet the requirement of the decoder. However, in practice, the bonding pads of address signals A3 and A9 are significantly separated from each other. Consequently, there is about 0.8 nsec delay among the various address signals. This may affect the timing adjustment important for the decoder function.

As far as the coincidence circuit of the redundant memory address is concerned, in the case when a defect exists in a portion of the memory cell, it is judged that the entire device is useless although most of the memory cells can function normally. When a product is determined to be defective by a multiprobe tester for the semiconductor wafer before its being cut into multiple chips, the defective chip is isolated from the other good chips and disposed of. The same disposal operation is performed when the device is found to be electrically defective during inspection after assembly of the device. Consequently, it is necessary to replace the memory containing defects or memory related to defects with other memory cells known as a redundant circuit. When a defective memory is detected by the multiprobe tester, the address corresponding to this memory is recorded and it is replaced by a redundant memory cell before the memory containing the defective cell is used. This mechanism can be realized by burning fuses. Use of the redundant memory and generation of the coincidence signal of the defective memory's address are very important for determining the overall performance of the device. That is, compared with the case of access to the conventional memory, when access is made to the replacement redundant memory, the speed is worse, and the performance of the device is thereby limited. Also, the performance of the device degrades in the case when excessive power is consumed by using the redundant memory. Consequently, the configuration of the redundant circuit, in particular, the address coincidence signal generating circuit, forms a portion of the DRAM, and the parameters of the redundant circuit are part of the inherent specification of the device and system.

FIG. 10 shows a conventional address coincidence circuit. It locates at the route between the transistor selected from multiple transistors and the common node between the transistors. According to conventional technology, a laser beam or high voltage is applied to burn a portion of the fuses corresponding to the prescribed address bits. The output of inverter 8 is used for sending out the signal associated with the redundant memory row. The gate of pull-up p-channel transistor 3 is connected to the output of inverter 5. The input of inverter 5 is connected to fuses 4 and the input of inverter 8. In the logic circuit shown in the left half of FIG. 10, address factors F0–F23 are displayed. These address factors are input into inverters surrounded by broken line 6. The circuit shown here can usually have a configuration with a small-scale circuit area. On the other hand, in order to adjust the delay of the address signal, it is necessary to generate the coincidence signal at the time the address signal farthest away from the decoder circuit is taken. Consequently, the operation speed is relatively low.

FIG. 11 shows the address coincidence circuit which can be used in the conventional 16M DRAM. The circuit for adjusting the address signal is formed by connecting field-effect transistor 166 to field-effect transistors 168, 170, and 172. These fuse circuits also contain inverter 162 connected to fuse 164. One terminal of transistor 172 is used to receive the address unit signal, one terminal of transistor 170 is used to receive the complement of the address signal. Transistors 170 and 172 perform the operation at a threshold voltage lower than that of the other transistor as shown in FIG. 11. In order to initiate the redundant memory cell corresponding to the selected address, the fuse is burned when the address bit selected corresponding to the signal sent to transistor 172 becomes logic "1," that is, the high logic level. On the other hand, when the address bit corresponding to the signal sent to transistor 172 is on logic "0," that is, the low logic level, the fuse is not burned. Attention should be paid to the fact that when fuse 164 is not burned, the gate of transistor 170 is energized and signal A_ on the terminal of transistor 170 is fed to the address factor. On the other hand, when fuse 164 is burned, the gate of transistor 172 is energized, and signal A is fed to the address factor. After the gate of transistor 166 receives the start pulse, the signals of address factors RA0–RA11 are generated, and each of them is input to one of multiple inverters 6. In order to start the redundant memory cell, all of address factors RA0–RA11 must be logic "0," and a low logic level signal must be generated at the output of inverter 8. In this case, fuse 4 is shown. However, this is not a necessity, and it is possible to create a program by burning fuse 164 in the address signal adjusting circuit in the preceding section. Consequently, the circuit can operate by setting any one of fuses 4 or fuses 164. Usually, this circuit is of a large scale since the number of the circuits for adjusting the address signal in the preceding stage must be the number corresponding to the address bit number. However, with the aid of switching transistors 170, 172, address input can be performed. Consequently, there is no need to adjust the timing. As a result, it is suitable for high-speed operation.

FIG. 12 shows the configuration of another address coincidence circuit used in the 16M DRAM. This configuration is similar to the configuration of the address coincidence circuit shown in FIG. 11, but differs in the connection structure of the p-channel transistor which drives the common node. That is, in order to stabilize the coincidence signal, the address agreement detection signal is fed back by the inverter, and the p-channel transistor is switched. When the redundant memory start signal PC is applied intermittently, it is also possible to precharge the node commonly connected to the various fuses. By applying the address signal on the gate of the n-channel transistor, it is possible to discharge the common node depending on the yes/no decision for the burning, of the fuse. However, in a large-scale memory IC with a large number of address bits, the electric resistance after burning of fuses as related to the decoding means for all addresses becomes a problem. Errors may occur when the common node is discharged when there is no intention to discharge the common node by means of the total resistance of the fuses connected in parallel. In addition, when the device is started, the driving ability of the p-channel transistor must be increased, and the area of the element is thus increased.

In the following, the other purposes, advantages, and features of this invention will be explained in detail with reference to embodiments illustrated by figures in such a way as to clear to specialists in the field.

OBJECT OF THE INVENTION

The major topics for the configuration of the address redundant coincidence circuit is how to ensure stable operation and to generate coincidence signals at a high speed by using a resistance after burning of fuses of about 80–100 k$\Omega$, as in the conventional case. That is, there is a demand for development of a configuration of the redundant address coincidence circuit which can prevent errors when the resistance value after burning of fuses is lower than a prescribed level due to burning of multiple fuses or imperfect burning.

The configuration of the redundant address coincidence circuit of this invention is a configuration of the redundant address coincidence circuit which performs selection of the fuses to be burned in response to a 1 or 0 to which initiation of the redundant memory corresponds. It has a means which can apply the address signal to the fuses through logic gates in response to the redundant mechanism start signal. It has the function of generating the redundant address coincidence signal by means of AND or NAND logic operation for the output logic values of the fuses with a number corresponding to the input address bits connected to the common node.

SUMMARY OF THE INVENTION

When the address coincidence circuit with the aforementioned configuration is started, the logic operation values for the output logic value of the p-channel transistor and the logic value of the input address bit by means of "NOR" gate are further logically operated by "NAND" gates via the various fuses. In this way, errors caused by the lower overall resistance value of the resistances of the conventionally burned fuses can be prevented. In addition, there is no time requirement for discharging the common node as in the conventional case. Consequently, the address coincidence signal can be generated at high speed.

BRIEF DESCRIPTION THE DRAWINGS

FIG. 8 shows the bonding pad assignment of the chip shown in FIG. 1.

Figure 1:
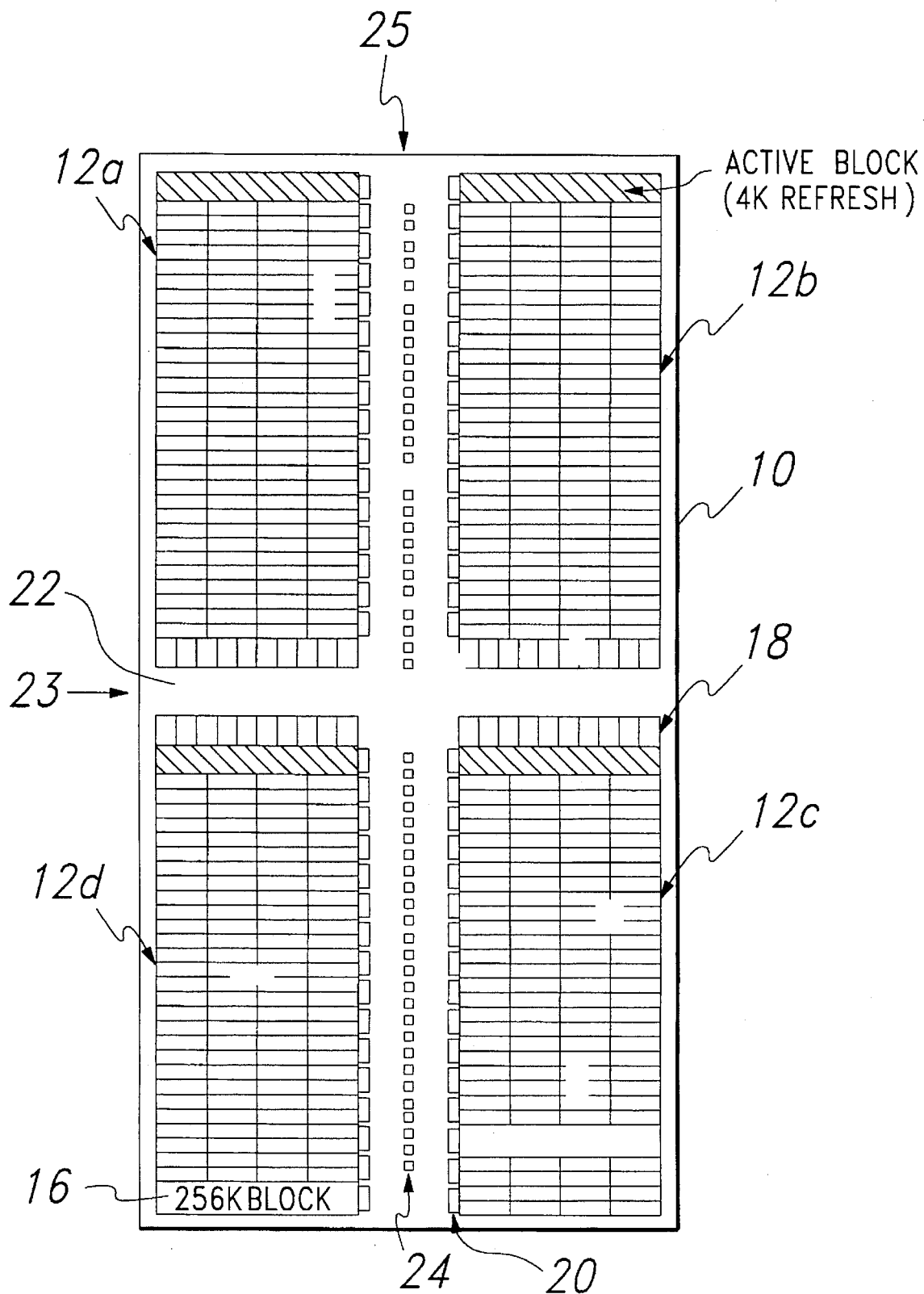
FIG. 1 is a plane view of the semiconductor memory chip.
Figure 2:
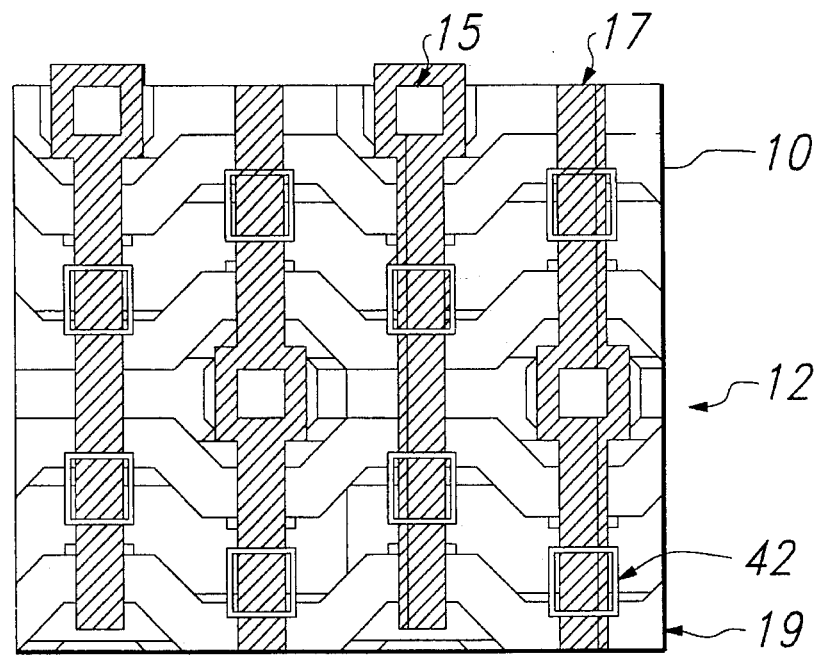
FIG. 2 is a plane view of a portion of the memory array.
Figure 3:
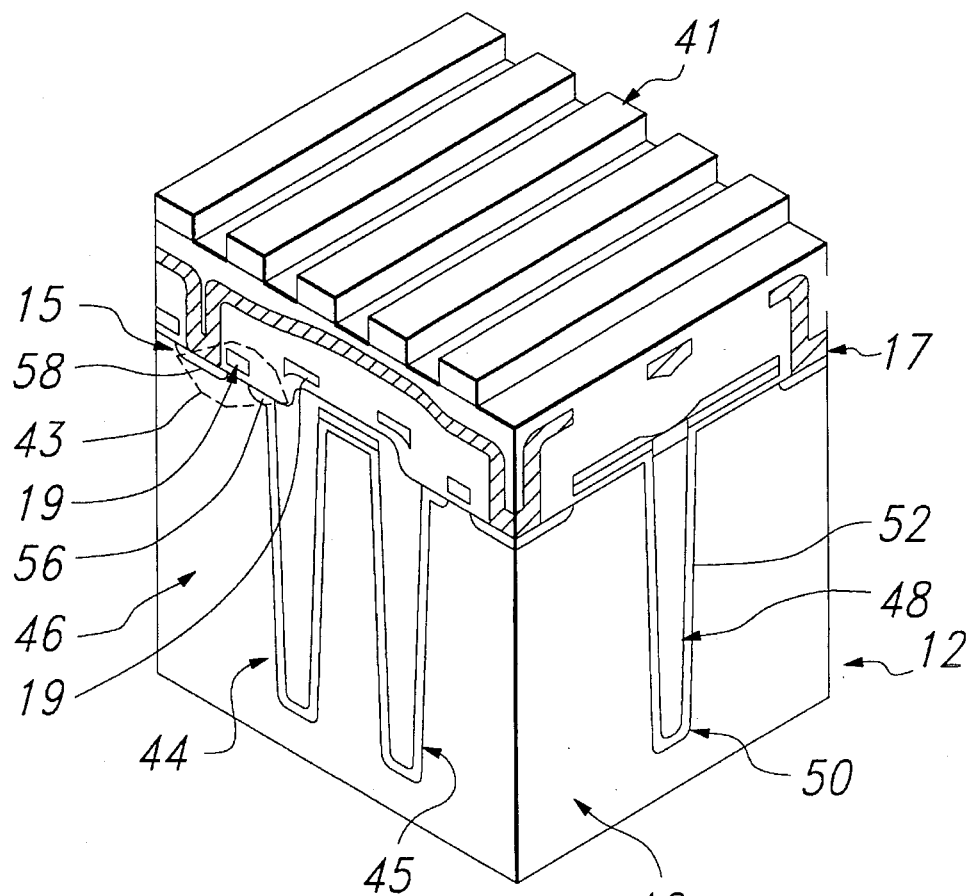
FIG. 3 is an oblique view of a portion of the memory array.
Figure 4:
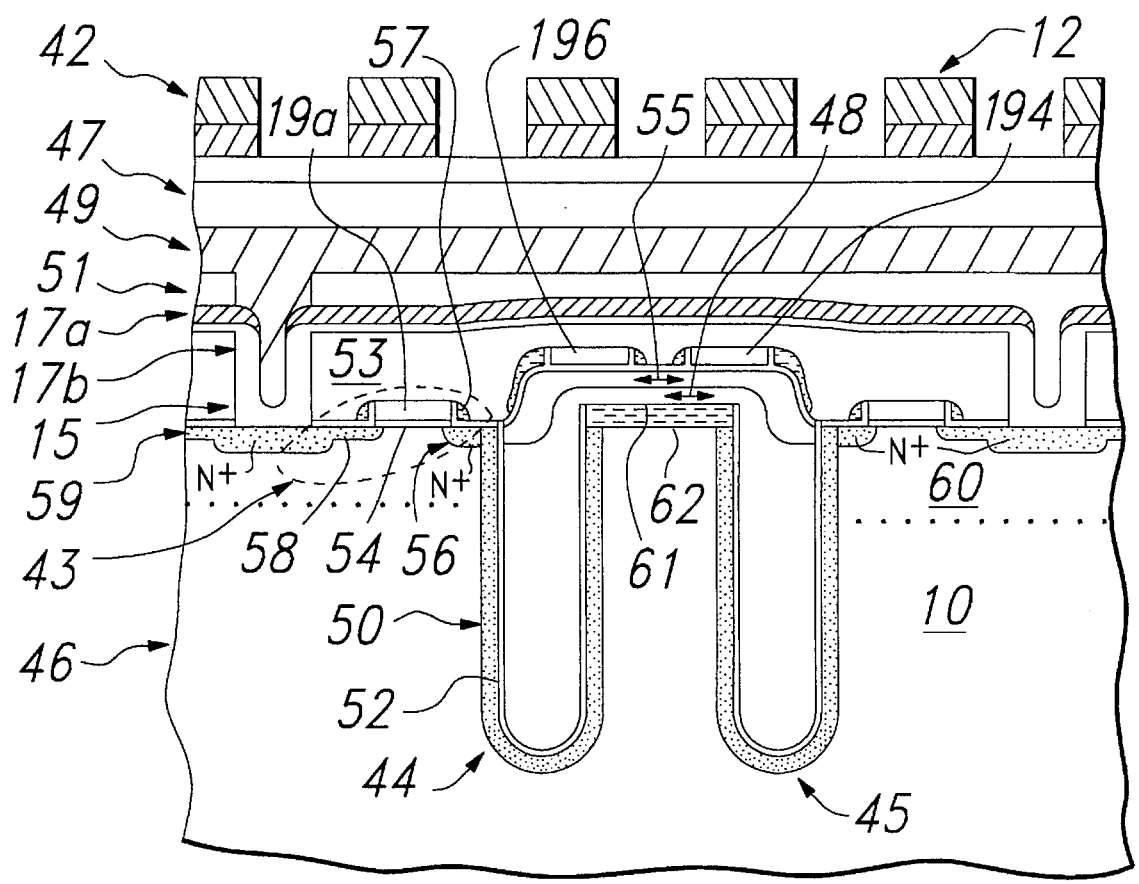
FIG. 4 is a cross-sectional view of the memory array.
Figure 5:
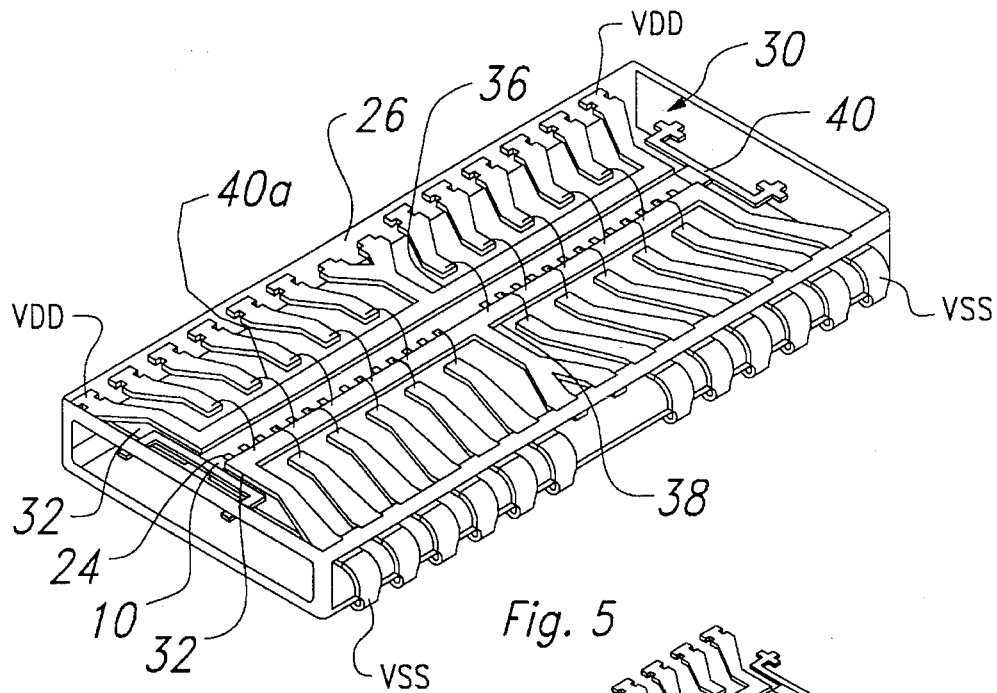
FIG. 5 is a 3-dimensional diagram showing the state in which the chip is sealed by resin.
Figure 6:
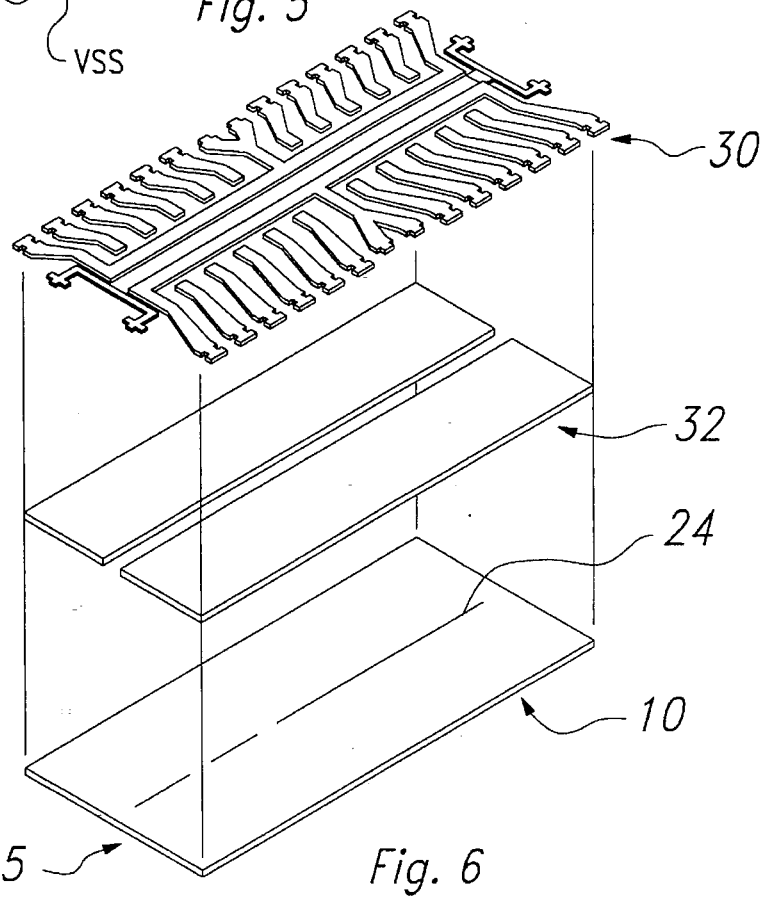
FIG. 6 illustrates the assembled state of the semiconductor device.
Figure 7:
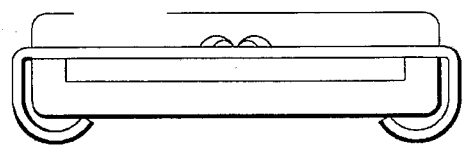
FIG. 7 is cross-sectional view of the semiconductor device shown in FIG. 5.
Figure 9:
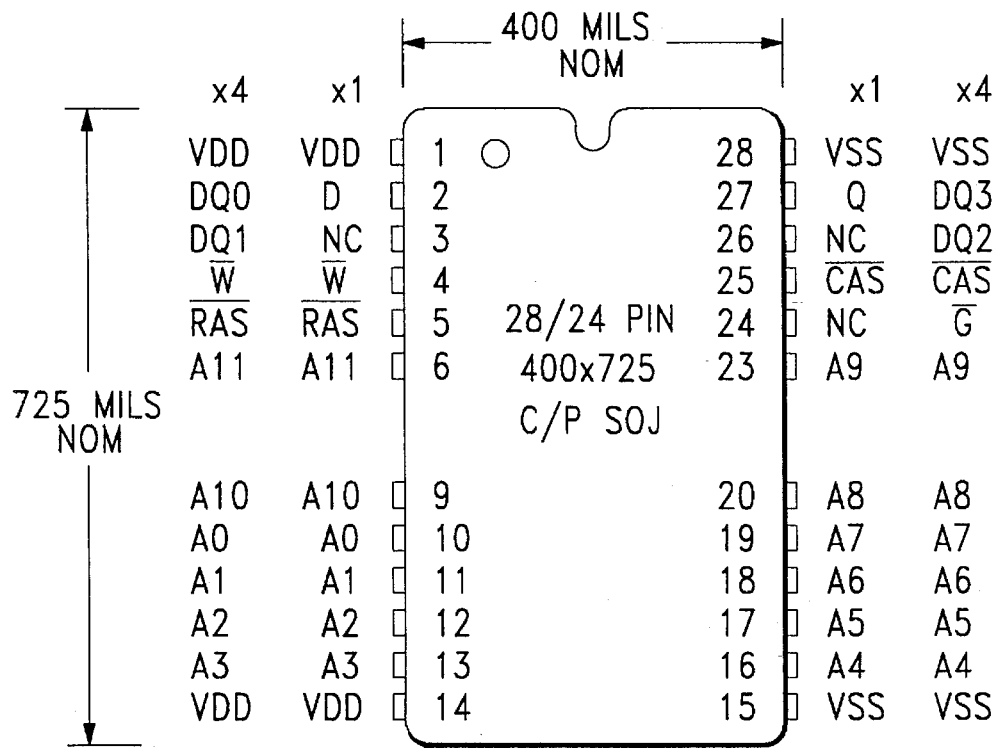
FIG. 9 shows the layout of the output pins of the semiconductor memory.

In reference numerals as shown in the drawings:
2, transistor group
3, p-channel transistor
4,164, fuses
5,8,162, inverters
6, inverter group
7, "NAND" gate
10, semiconductor chip
12a, 12b, 12c, 12d, memory quadrants
15, bit line contact
16, memory block
17, bit line
17a, titanium layer
17b, polysilicon layer
18, decoder
19, word line
19a, gate of passage transistor
22, peripheral circuit
24, bonding pad
26, resin sealant
30, lead frame
32, polyimide tape
38, power source bus lead
40, bond wire
40a, lead finger
41, 42, mutual connectors
43, transfer gate transistor
44, 45, trench capacitor region
46, semiconductor substrate 47, 51, 53, 55, insulator layer
48, field plate
49, multilevel interconnect line
50, impurity region
52, memory dielectric substance
54, gate oxide film
56, source region
58, drain region
59, high-concentration N-type impurity diffusion portion
60, P-tank region
61, nitride layer
62, oxide layer
65, "NAND" logic gate
68, redundant mechanism start signal
70, "NOR" logic gate
166, 168, 170, 172, field-effect transistors
194, 196, word lines
202, defective memory
204, redundant memory
206, address bus
208, fuse decoder
300, redundancy energization line
302, redundancy selection line
304, memory block
306, redundant row
308, predecoder
312, MS signal

TABLE I

| Type | Form of re- dundancy | Yield limit (block units) | Number of decoders | Number of redundant word lines |
| --- | --- | --- | --- | --- |
| A | ANY TO ANY | 8 words/4M (32 decoders/32M) | 64 Decoders | 512 Lines |
| B | ANY TO ANY | 8 words/4M (32 decoders/32M) | 64 Decoders | 512 Lines |
| C | Fixed | 2 words/512K (2 decoders/2M) | 64 Decoders | 512 Lines |
| D | ANY TO ANY | 2 words/2M (2 decoders/16M) | 8 Decoders | 128 Lines |
| E | Semi- fixed | 4 words/512K (12 decoders/16M) | 12 Decoders | 128 Lines |

DESCRIPTION OF THE PREFERRED EMBODIMENTS

In an embodiment of this invention, the memory device consists of multiple memory arrays which have memory cells set in matrix form and have redundant row group of the memory cells for replacing the defective row groups, and a support circuit for reading information from the memory cell and writing information to the memory cell; the support circuit includes a row redundant circuit which can select the redundant row of the memory cell only within the memory array which has a defective row group of the memory cell in response to the defective row group address of the memory cell. It is preferred that the row redundant circuit contains a 2-stage row redundant decoder which is programmable by means of burning of fuses in a way that enables the holding of the information for identifying the memory array that is programmable and which contains the defective row of the memory cell with the defective row address.

In another embodiment of this invention, the memory device integrated on a single semiconductor substrate has multiple memory arrays which have memory cells set in matrix form and the redundant column group of memory cell for replacing the defective array, and a column redundant circuit for selecting the redundant column group of memory cell only in the memory array which has a defective column of the memory cell in response to the defective column group of the memory cell. It is preferred that the column redundant circuit contains a 2-stage column redundant decoder which is programmable in a way that enables the holding of the information for identifying the redundant column that identifies the memory array that is programmable and which contains the defective column of the memory cell with the defective address. It is preferred that the memory device contains the following parts: programmable first redundant decoder which holds the address of the defective row, receives the row address and generates the redundant row decoding signal and redundant row factor signal, programmable second redundant decoder which holds the position of the array containing the defective row, receives the redundant row decoding signal, and generates the array selection signal, and a redundant energization circuit which has the redundant row factor energization signal of the second redundant decoder and the array selection signal of the second redundant decoder, and which is connected to the redundant row of the memory cell and energizes the selected redundant row of the memory cell in the memory array having the defective row of the memory cell.

According to this invention, the memory device may contain the memory device disclosed in any of the claims containing the row redundant circuit and column redundant circuit.

In another embodiment of this invention, the method for repairing the defective memory cell in the semiconductor memory device having multiple memory arrays is performed in the following steps: a first circuit is programmed by the address of the defective memory cell; a second circuit is programmed by the position of the memory array having the defective memory cell; and the redundant memory cell is selected in the memory array having the defective memory cell upon receiving the address of the defective memory cell. The redundant row memory cell is preferred. Or, the defective memory cell is the defective column cell, and the redundant memory cell is the redundant column cell.

As a portion of this invention, the 2-stage decoding circuit for the typical semiconductor memory device is disclosed. The redundant row decoder is a 2-stage decoder which has a first redundant decoder which can be programmed for holding the address of the defective row, and which receives the row address and generates the redundant row decoding signal and redundant row factor energization signal. The second redundant decoder receives the redundant row decoding signal, connects to the redundant row of the memory cell that outputs the signal for selecting the memory array, and energizes the selected redundant row of the memory cell of the memory array containing the defective row of the memory cell by adding a third tolerable section in response to the redundant row factor energization signal and array selection signal. The redundant column decoders can be programmed to hold the address of the defective column. They receive the column address and generate the redundant column decoding signal and redundant column factor energization signal. The second redundant column decoder can be programmed to hold the position of the array containing the defective column. It receives the redundant column decoding signal and can energize the selected redundant column of the memory cell containing the defective column of the memory cell by means of addition of a third tolerable section in response to the column factor energization signal and array selection signal. The decoder circuit can identify the memory portion, and can make effective use of the usable memory cells. In the following, the memory chip as an embodiment of this invention will be explained.

Figure 13:
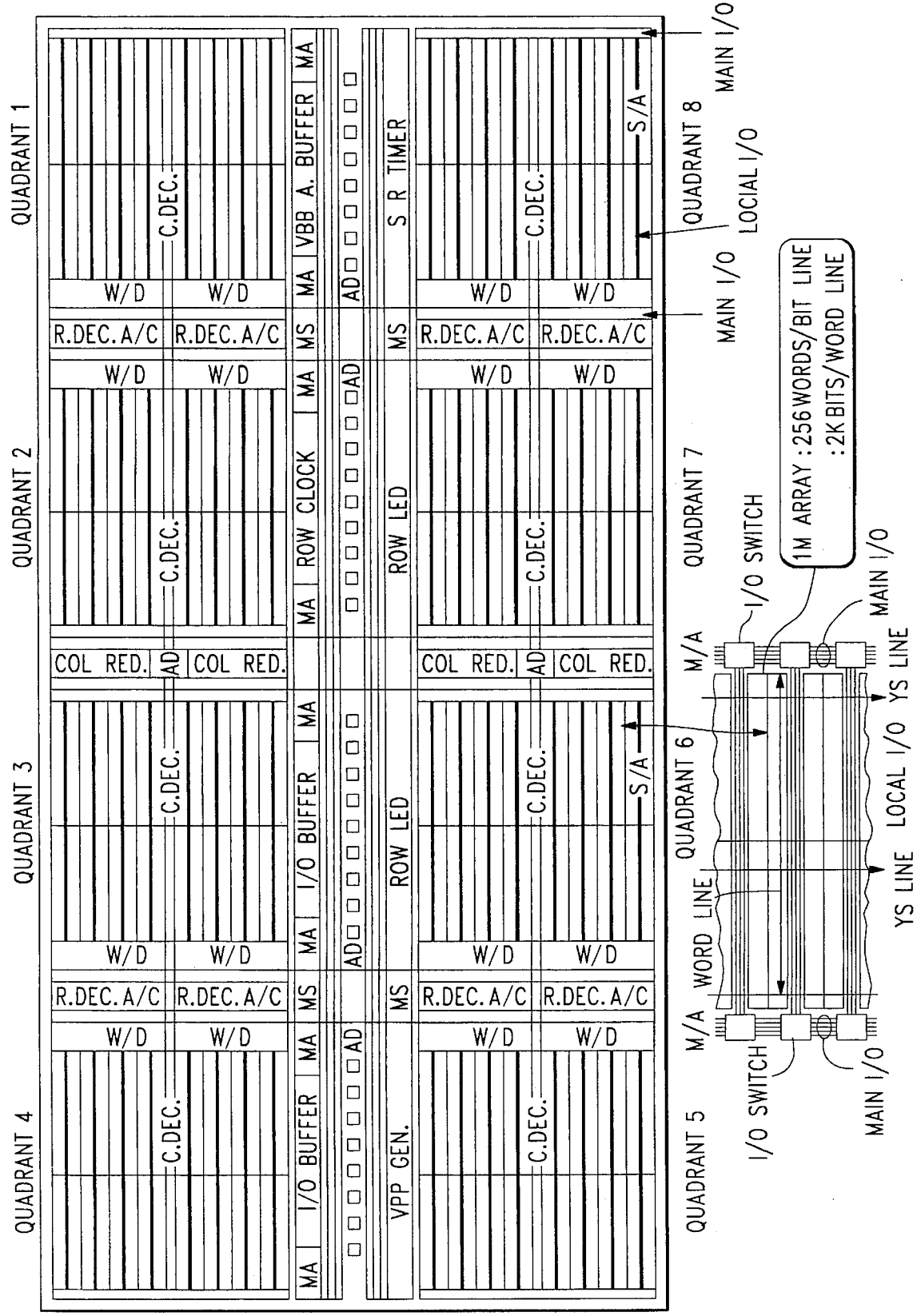
FIG. 13 is a plan view of a 64M DRAM.

FIG. 13 shows a 64 Mb dynamic random access memory chip known as 64M DRAM. This chip is divided into eight equal memory quadrants, each having 8 Mb. Each of the eight equally divided quadrants contains eight 1Mb memory blocks. Each memory block is made of two 512K bits portions. The column decoder (C. dec) is set at the center of each memory quadrant along the axial line extending in the longitudinal direction as viewed from above. The row decoder (R. dec) is set along the axial line in the transverse direction of the chip adjacent to the corresponding memory quadrant. The peripheral circuit containing input/output buffer (A. buffer, I/O buffer) and timing circuit (S. R. timer, Row clock,) and control circuit (Row red) is located at the central position along both the horizontal axis and vertical axis of the chip. A bonding pad is set at the center along the vertical axis of the chip.

Figure 14:
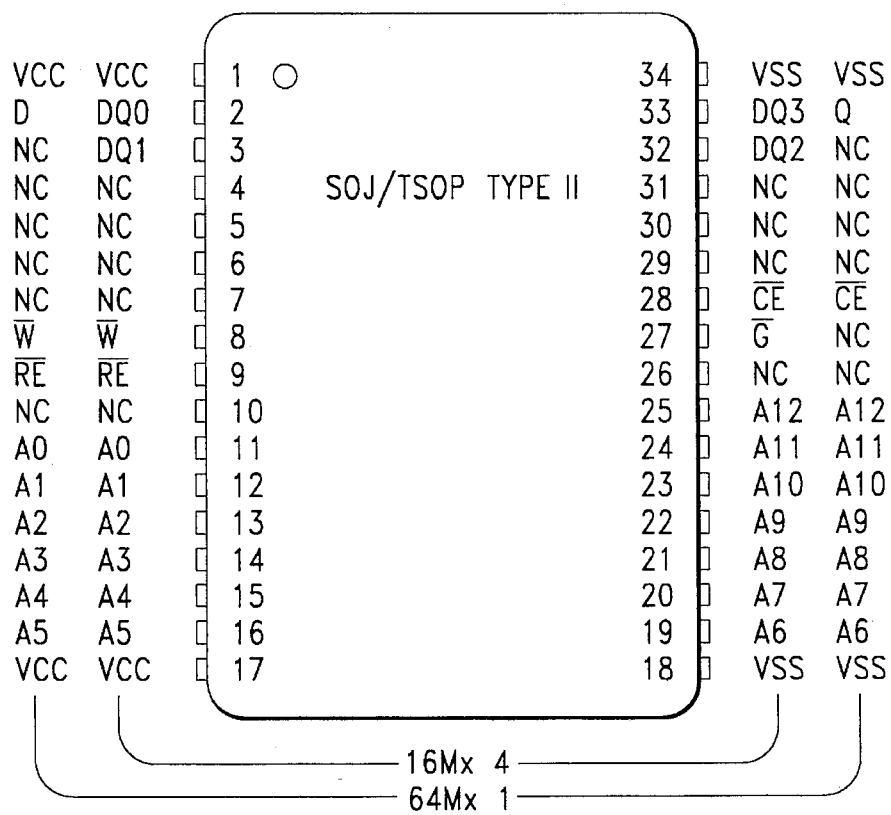
FIG. 14 shows the 64M DRAM pin layout diagram with the configuration of 64M×1 bit and 16M×4 bits.
Figure 15:
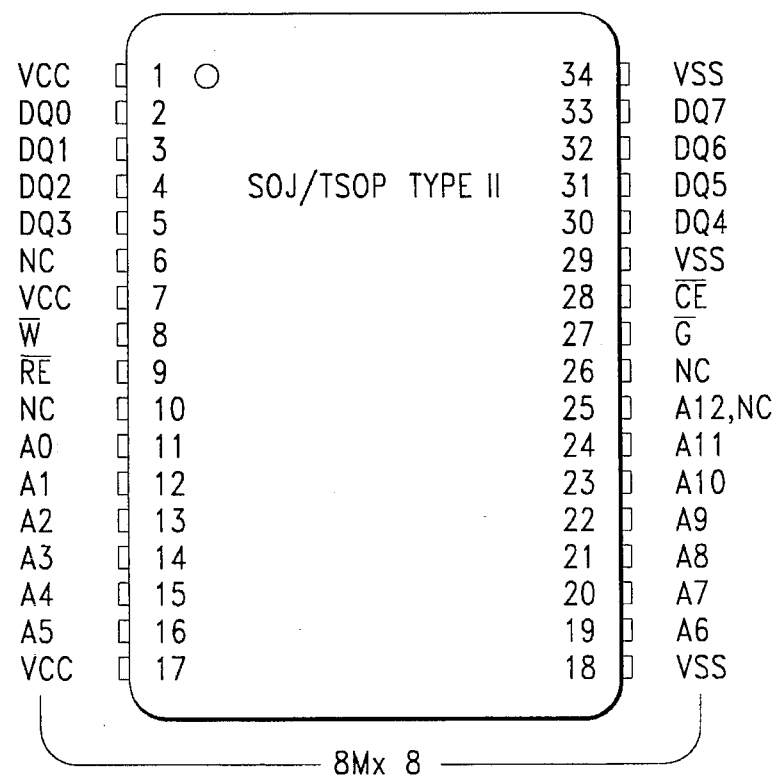
FIG. 15 shows the pin layout of 64M DRAM with a configuration of 8M×8 bits.
Figure 16:
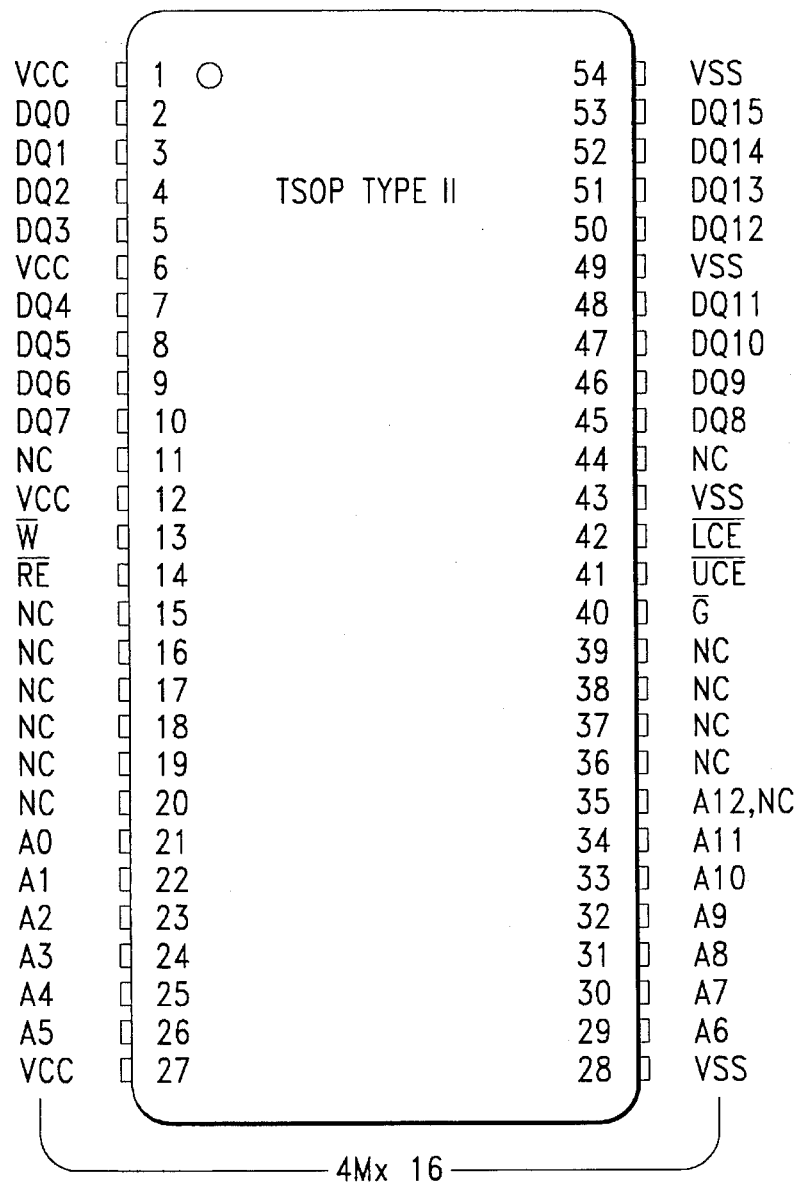
FIG. 16 shows the pin layout of 64M DRAM with a configuration of 4M×16 bits.

FIGS. 14–16 illustrate the general characteristics of the 64M DRAM. This device has a typical 3.3 V external power source $V_{DD}$. In order to reduce the power consumption tunnel hot carrier effect, the internal power source voltage regulator (VPP gen) on the same chip sources 1.65 V, which is half of VPP, to the memory array. Also, 4.0 V is sourced to the peripheral circuit. The substrate is reverse-biased to 1.5 V. This configuration has the programmable x1, x4, x8, or x16 bits by means of bonding. This option can be selected by connecting the same prescribed bonding pad as that used in the conventional technology in the manufacturing stage to $V_{ss}$ by the bonding wires. Since the capacity of the memory is larger than that for the conventional case, the 34-pin package shown in FIGS. 14 and 15 can provide x1, x4, or x8 bits configuration. The 54-pin package shown in FIG. 16 provides a device with a configuration of x16 bits. They allow the optimal selection for the enhancement page mode together with a combination of the programmable option by the metal mask with respect to the write operation (data mask) for each bit and the aforementioned bonding option. Furthermore, as the option for the refreshing mode, selection can be made between the 4K refresh mode with 4096 cycles in 64 msec and the 8K refresh mode with 8192 cycles in 64 msec. This DRAM can be programmed by means of the bonding option to either 4K or 8K refresh mode. Selection of the option can be realized by using a method similar to the method used for selecting the option of the configuration of x1, x4, x8, or x16. The DRAM has a prominent feature that it can be designed for many types of tests. Test mode entry 1 is performed by the key addressless WCBR for the x16 internal parallel test. Test mode entry 2 is a WCBR equipped with key address and over-voltage (8 V for All). For exiting test mode, release can be performed by any refresh cycle (CBR or RAS only). Test mode entry 1 is an industrial standard x16 parallel test. This test is similar to that used in the 1 MB, 4 MB, and 16 MB DRAMs. However, it differs in that instead of 8 bits, 16 bits are compared at the same time. Test mode entry 2 has many tests. It contains the x32 parallel test equipped with data comparison and the x16 parallel test equipped with data comparison. The storage test and $V_{DD}$ margin test of the storage cell allow connection of the p-channel transistor device from external $V_{DD}$ to internal VARY and VPERI device power source line via the p-channel transistor device. The other tests included are redundant signature test, row redundant row call test, column redundant column call test, word line leak detection test, clear simultaneous test, and reset to the normal mode. The DRAM contains the test effective method indicating whether it is kept in the test mode or not.

Figure 17:
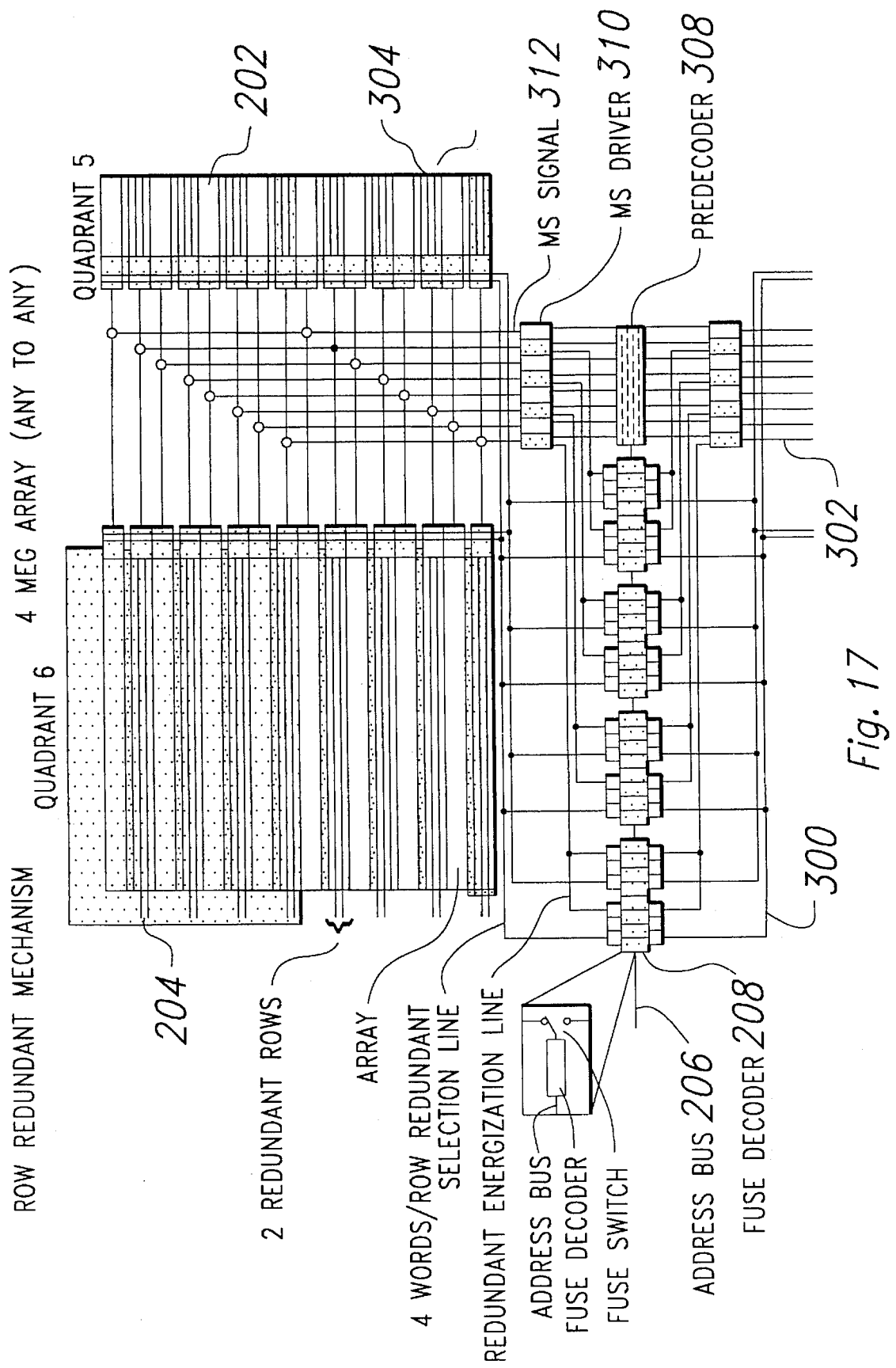
FIG. 17 shows the redundant mechanism of correction of defective memory cells for 64 DRAM.

FIG. 17 shows the redundant mechanism for compensating defective memory cells 202 of the 64M DRAM. This is carried out by replacing the defective memory with normally operable redundant memory 204. Thirty-two fuse decoders 208 commonly connected to address bus 206 are arranged at the center of the chip. This does not cause an excessive detour of the address bus lines. That is, in the case when ANY TO ANY redundant mechanism is used, when the redundant memories at memory quadrants furthest away from each other, such as the quadrant 1 and the quadrant 5, are mutually used, the redundant energization line and the redundant selection line with the shortest distance are sufficient. Consequently, the chip area can be used effectively, and the shortest redundant energization line and the redundant selection line are sufficient; hence, a delay in the timing is also reduced; and the time for accessing the device can be reduced. On the other hand, in the case when fuse decoder 208 is set on the periphery instead at the center of the chip, wiring becomes difficult for the commonly used redundant energization line, redundant selection line, and address bus, and the area is not utilized efficiently. For 512 Kb memory block 304, there are four (only two are shown in the figure) redundant rows 306. These four row lines can be used simultaneously. For the 32 decoders for each redundant row, any programming method is allowed. There are 13bit column addresses for each redundant row decoder. For the row redundant program, fuses F0–F11 are used (see FIG. 36). For each single cycle of repair, up to 12 fuses can be burned. For the row redundancy, in order to perform the operation with a high yield, [ANY TO ANY]program can be performed. When this ANY TO ANY redundant function is used, the 64 redundant rows present in one quadrant can be selectively allotted to all of the quadrants including the aforementioned quadrant. Consequently, the redundancy can be increased to about 6 times that of the fixed or flexible fuse decoder with the redundant memory set in the prescribed memory block. In addition, since programming is performed for predecoder 308 with respect to the memory quadrant, for MS signal 312 with respect to the memory block in each quadrant, and for fuse decoder 208 with respect to the row address of the memory, the number of fuses F0–F11 and the number of decoders 208 can be optimized. FIG. 17 shows the redundant function with respect to the address. However, with the same configuration, it is also possible to program the redundant function with respect to the column address. In addition, with a fast evaluation as to whether the redundant row can be used or not, 2-stage decoding can be performed by means of 2-stage programmable predecoder 308 and fuse decoder 208. Table I lists the comparison for the row redundant function.

Table I

Figure 18:
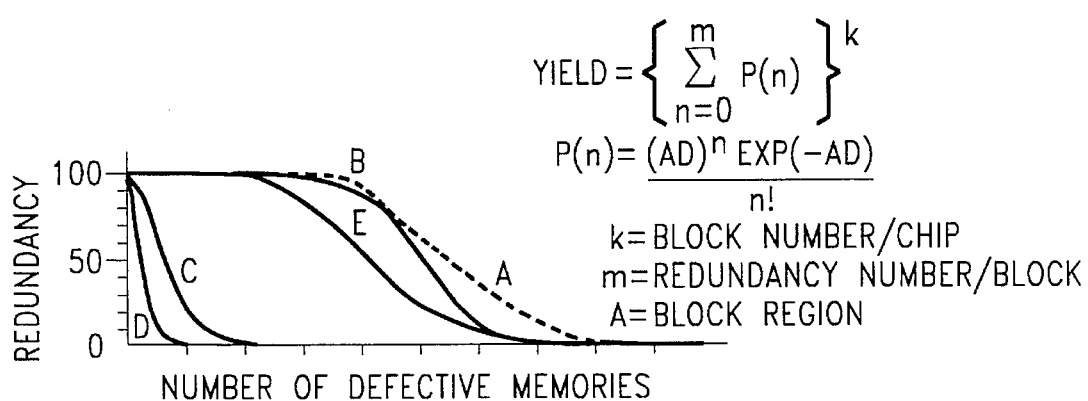
FIG. 18 shows the correlation diagram of defective memory number and redundancy by means of yield.

FIG. 18 shows the relationship between the number of defective memories in a prescribed area (abscissa) vs. redundancy (ordinate) for models A–E. The broken line represents model A of the 64M DRAM, while the solid lines show the other models B and E of the 64M DRAM. Although the area remains the same for the various memory cells, they nevertheless have different redundancies due to their different quadrants, word configurations, and bit line configurations. On the other hand, C and D show the redundancy configurations when the 16M DRAM, etc. are used. All of the redundancies are calculated on the basis of the number of defects in unit area. Here, attention should be paid to the fact that the ANY TO ANY method tolerates about four times the defective memory of those in the conventional case in the stage with a yield of over 80% as an indication of the maturing period on the basis of the well-known curves for semiconductor devices. That is, for the defective devices containing four times as many defective memory cells as the conventional method without redundant repair, by using the ANY TO ANY method, only 20% of the chips have to be disposed of, while the remaining chips can be assembled and shipped after passing the subsequent electrical tests.

Figure 19:
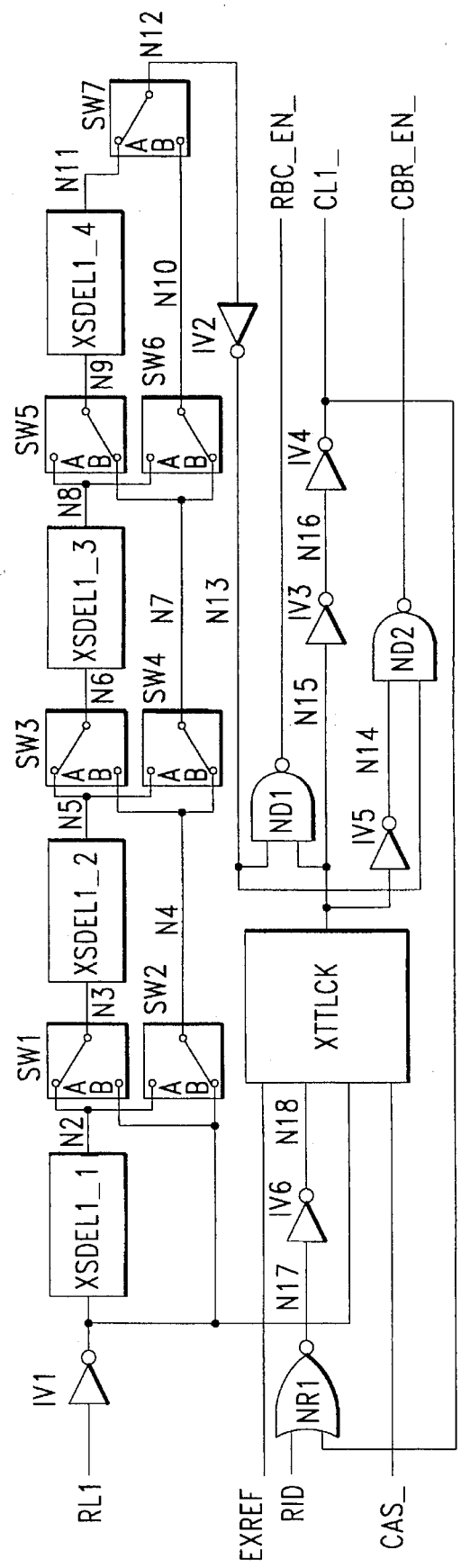
FIG. 19 is a circuit diagram of CBR (CAS BEFORE RAS) detector.

FIG. 19 shows a CBR detector. In addition to checking the CBR (CAS BEFORE RAS) state, it also converts the external TTL logic level CAS_signal (CAS bar signal) to the CMOS logic level, and generates internal CAS clock CL1_. As it is able to start the redundant address coincidence signal upon receiving the redundant mechanism start signal after CBR detection, no error address is decoded. The first portion of the circuit is XTTLCLK, a converter from TTL to CMOS. It starts only when the signal conversion controlled by internal RAS clock and RL1 sets RL1_to the high state. Even in the case when RL1 is changed from the high state to the low state by feedback of internal CAS clock CL1_, XTTLCLK can still be kept active. With this configuration, the device can operate when CAS_remains active low after RAS_, that is, the extended CAS, becomes high. However, during the CL1_period, before the loop enters the converter, it is gated by the power up signal RID. This can avoid the undesired switching of the converter during power up. The second portion of the circuit performs sampling of the CAS_signal when RL1 goes high. If CAS_ is low at this time, that is, when $CAS_{13}$ falls before RAS, CBREN_becomes active low, and CBR cycle is displayed. Although RBCEN_remains high, if CAS_is at the high level, an inverted logic signal value is present in the output, and the standard RBC (RAS BEFORE CAS) cycle is displayed. Attention should be paid to the fact that as long as RL1 is at the high level without performing latching, the sampling operation continues. When the CAS_signal changes the state during the cycle, output CBREN_and RBCEN_vary together. However, the output is ineffective (DON'T CARE) after it, and the latching of the initial output is performed in the RBC circuit, and a programmable delay is used for controlling the start of sampling.

Figure 12:
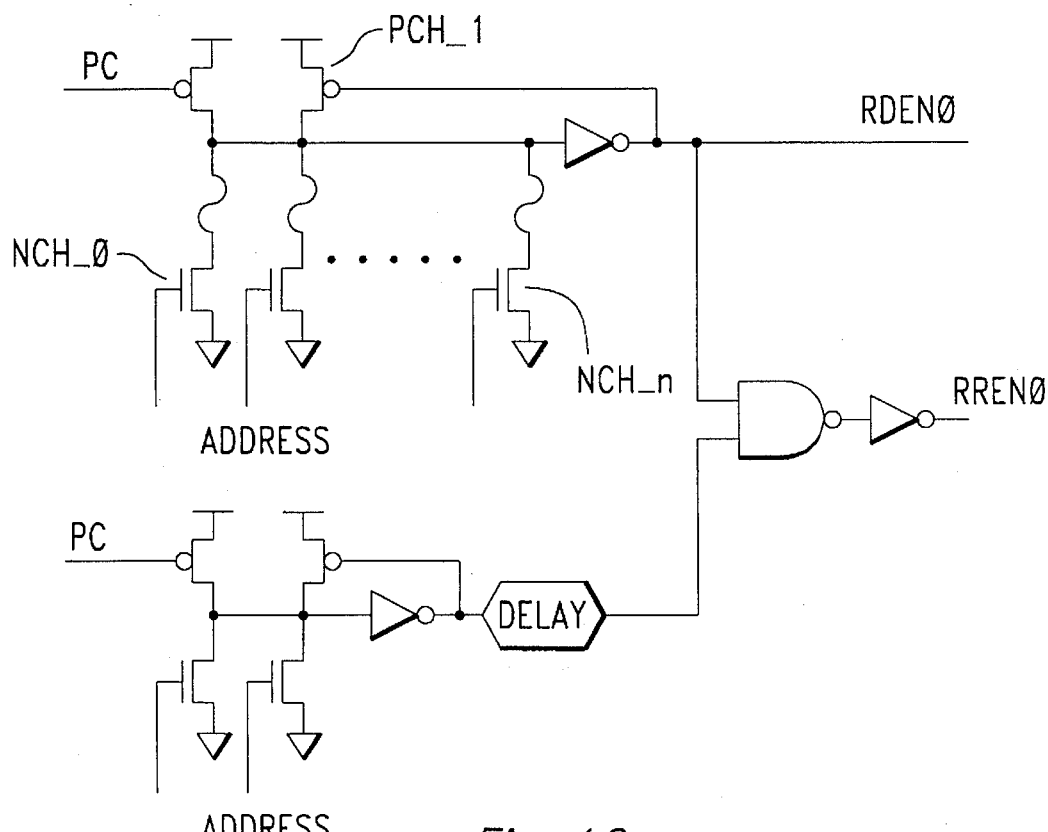
FIG. 12 shows another address coincidence circuit used in the 16M DRAM.
Figure 10:
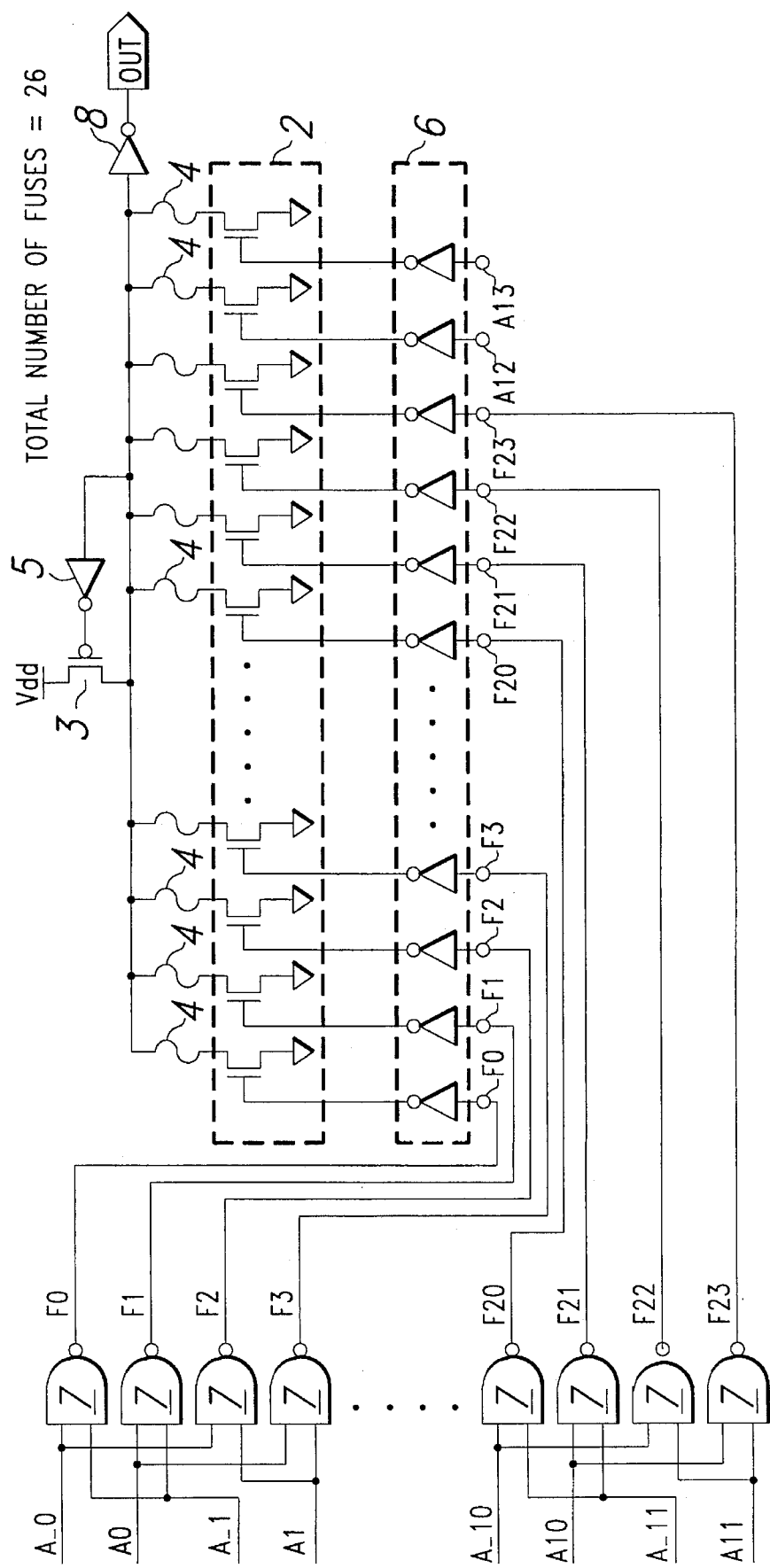
FIG. 10 shows a conventional address coincidence circuit.
Figure 11:
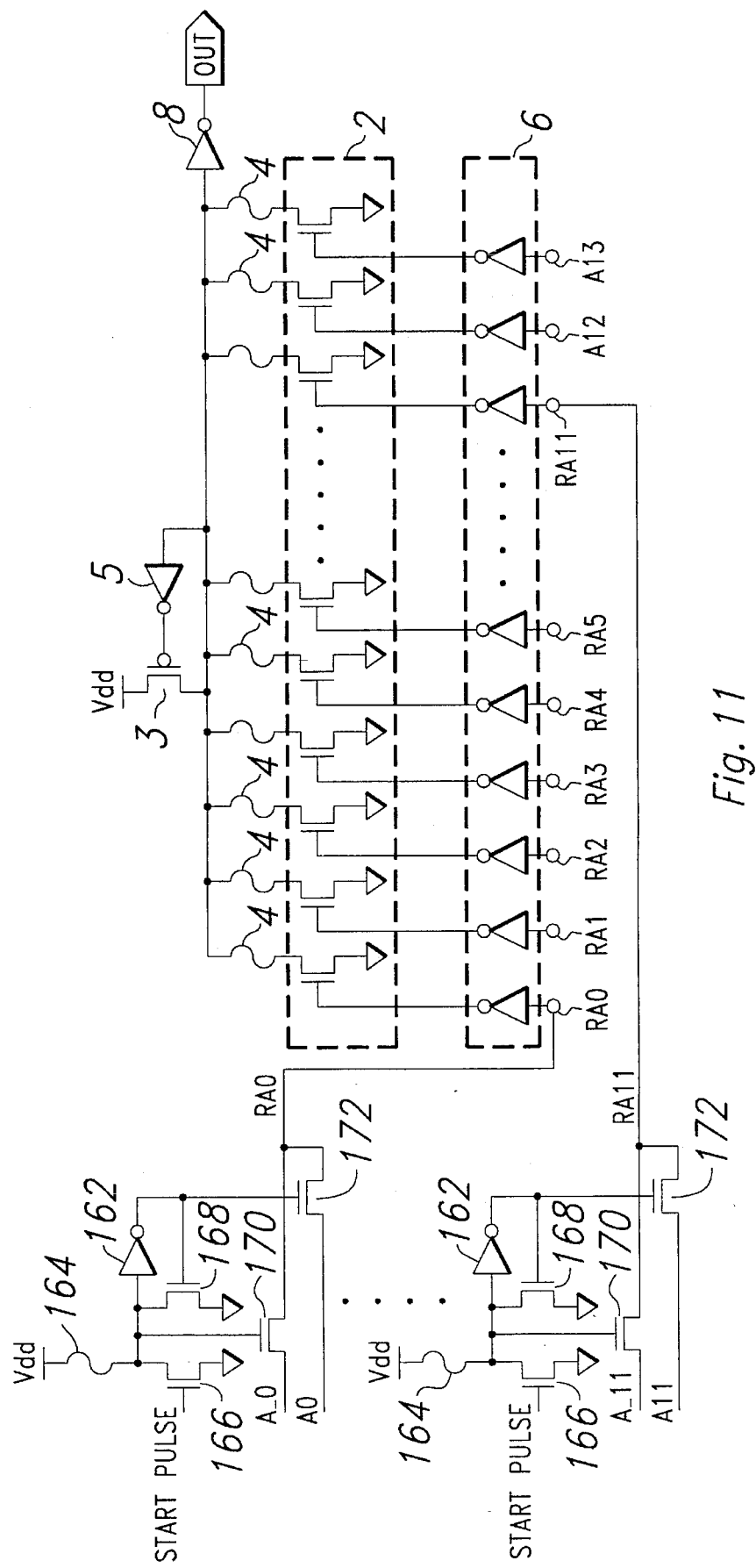
FIG. 11 shows the address coincidence circuit which may be used in the 16M DRAM.
Figure 20:
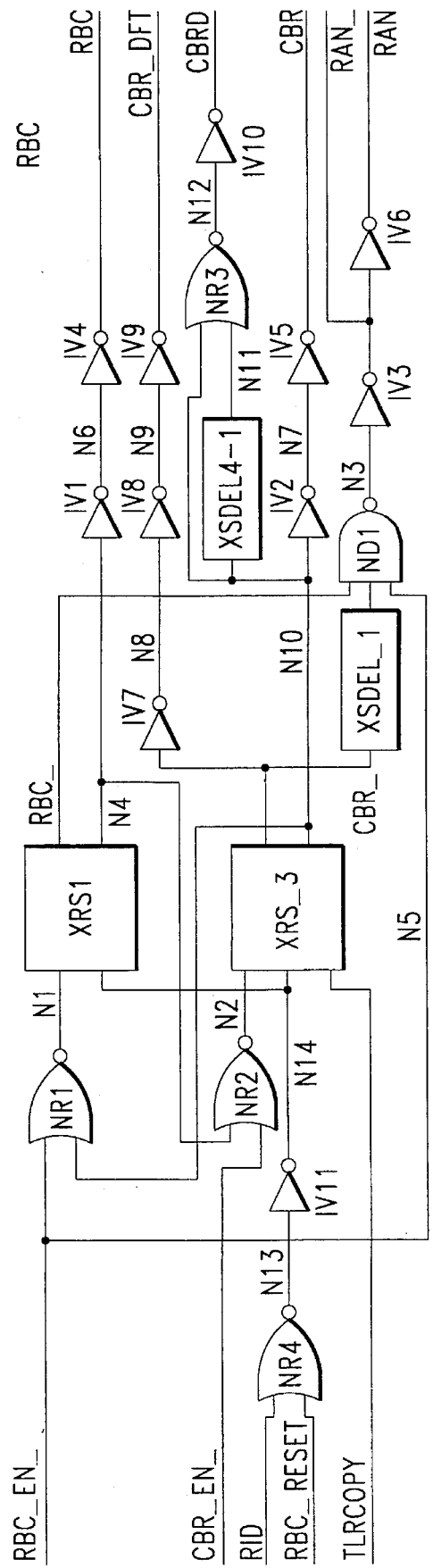
FIG. 20 is a circuit diagram of RBC_RESET (RAS BEFORE CAS RESET) detector.
Figure 21:
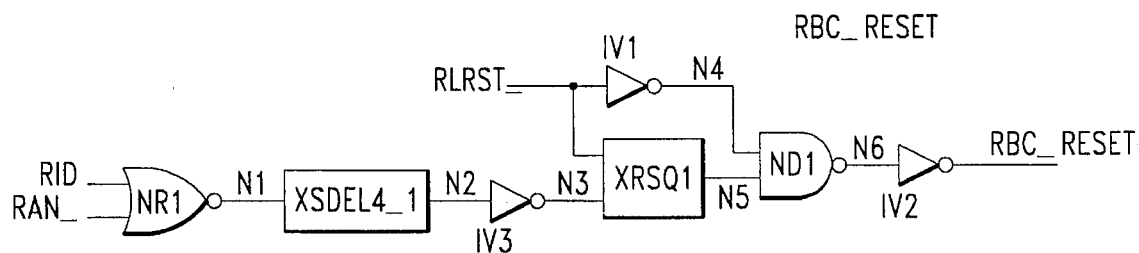
FIG. 21 is a circuit diagram of RBC_RESET (RAS BEFORE CAS RESET).

FIGS. 20 and 21 show the RBC_RESET (RAS BEFORE CAS RESET) circuit. As discussed for CL1 circuit, it defines the type of operation of the device with the initial output of CBREN_and RBCEN_, that is, RAS BEFORE CAS or CAS BEFORE RAS. Consequently, it is necessary to latch the initial output over the entire period. This latching operation is performed within RBC circuit. At the end of the cycle, RBC_RESET circuit resets the latch and finishes preparation for the next cycle. In addition to latching CBREN_and RBCEN_, RBC also generates the RAN signal for gating the row address. AS the redundant address coincidence signal generating circuit is started in step with the RAN signal, it is able to determine at an early stage whether a standard memory cell is selected or a redundant memory is selected. Latching of RBCEN_and CBREN_signal is performed by means of two interlocking latches XRS1 and XRS_3. In the precharge state, one of the two latches is excited by the active low signal from RBCEN_or CBREN_. Then, the excited latch is locked by excitation of the second latch. As shown in FIG. 12, at the end of the RAS_active cycle when the lock goes low, the energization is released, the latch is reset and the locked RBC RESET pulse is generated. RLRST_is the precharge signal generated at the rising front edge of RL1_after a prescribed delay. In the standard operation, RBC for RAS BEFORE CAS cycle or CBR for CAS BEFORE RAS is set to the high level.

Although CBR_DFT signal follows the CBR logic, it is not used in the standard operation. Consequently, no delay takes place in the conventional cycle. The same signal having a falling edge with a delay from CBR is generated. This is a CBRD signal, and it is used as the increment clock signal for the internal counter of CAS BEFORE RAS. Incrementation is performed upon the falling edge of this signal. Consequently, by delaying the internal counter, a sufficient time is available for turning off the row address buffer before change to the internal counter address takes place in the device. Consequently, no error address can enter the memory array. For the redundant memory address decoder, if the CBR is in continuous refresh mode, then it is possible to take in the incremented address and to establish the coincidence signal on whether there is switch to the redundant memory without taking the output of the row address buffer. Of course, selection of the row address line in preparing the coincidence signal may also be performed at the start of the next cycle. If the device is in the DFT ROW COPY mode, XRS_3 latch acts as an inverter of node N2 and outputs CBR_; CBR is released from the energization to the low logic level. The normal operation is performed as long as both node N2 and RBC_RESET are not at the high logic level at the same time. Since this state does not take place in the conventional sequence, for the 64M DRAM which can guarantee a long refresh interval, after performing CBR refresh containing delay for the memory cells related to the total row address, a remaining refresh interval longer than the CBR refresh period is used for accessing the memory with the conventional cycle without generating a delay. This is preferable. In this setting, RBC is still latched, and CBREN_signal has its lock off. However, in the CAS BEFORE RAS operation, since CBREN_is effective during the entire cycle, it is necessary to have output CBR_DFT. For this purpose, as long as RAS_is at the low level, CAS_is set to the low level. For both CBR and CBRD, the energization is released as it goes to the high level in the test mode. In the case when CAS BEFORE RAS cycle is implemented in the test mode, they release the energization and prevent use of the internal CBR counter as the row address. In this test mode, reset is performed by means of RBC_RESET in the standard RAS BEFORE CAS cycle at the end of the active cycle. In the CAS BEFORE RAS cycle, at the end of the active cycle, the reset operation is performed by changing the logic value of CBREN_to the high level. In the other portion of the circuit, ROW ADDRESS ENABLE signal, RAN and RAN_are generated. These signals may be generated in any active cycle. With respect to the typical RBC type cycle, it is necessary to generate these signals as fast as possible. Consequently, the falling edge of the RBC_EN is used to trigger the transition of the RAN signal. RBC_signal is used to keep the RAN signal active during the RAS_precharge period. With respect to the CAS BEFORE RAS operation, it is necessary to ensure that execution of RAN signal is delayed and the address buffer functions appropriately. In these two circuits, power up signal RID is used to preset the initial state of the latch. The delay section XSDELI delays the claim of RAN from CBR_, and it gives a sufficient time for CBR internal address to reach the row address buffer before energization of the buffer by RAN. Consequently, it is possible to prevent extraction of error address data from the row address buffer, and it is possible to prevent errors in switching of the redundant memory. RAN_is also used in resetting RBC_RESET.

Figure 22:
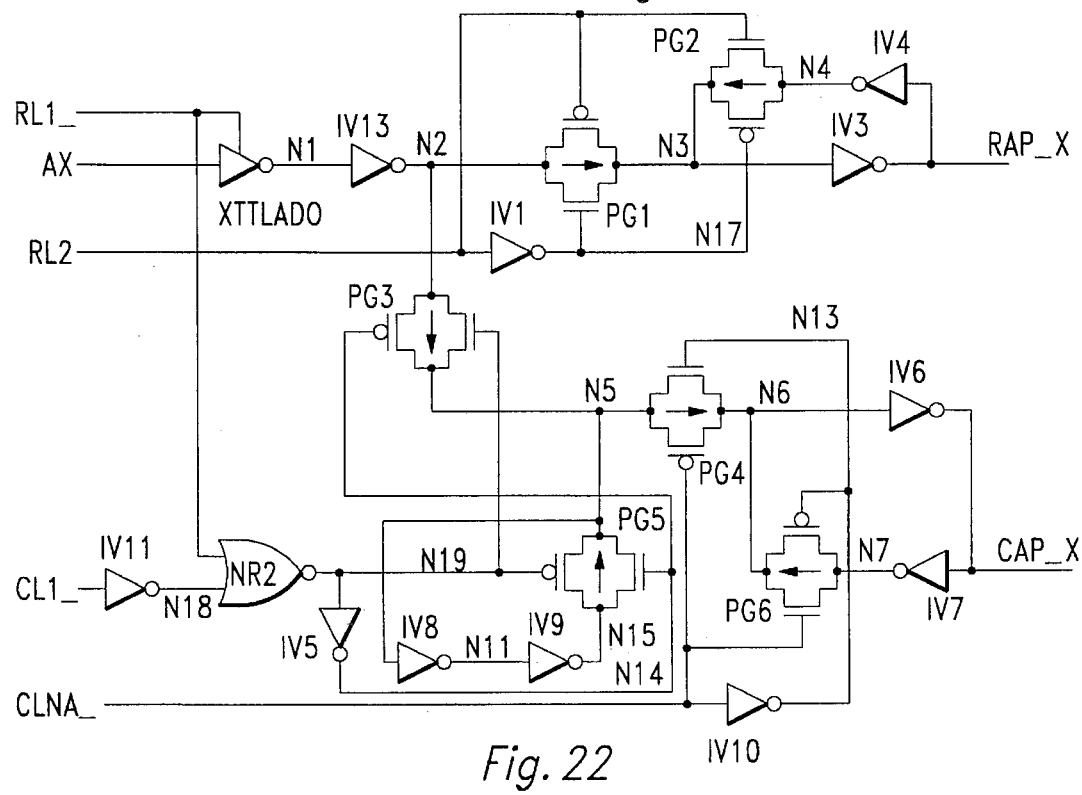
FIG. 22 is a circuit diagram of PADABUF (PAD ADDRESS BUFFER).

FIG. 22 shows PADABUF (PAD ADDRESS BUFFER) circuit. It is used for multiplexing the data from the address signal pins and latching them as the row address $RAP_{13}X$ and column address CAP__X. This signal can be treated as the input of the redundant address decoder. In the first stage of the circuit, when the internal RAS signal RL1__becomes low, the TTL level signal of the address is converted to the CMOS level signal. The delayed RAS signal RL2 is then latched to the row address. There is also a delay without latching of the address by RL2. In this way, the device has a time in which the precharge is ineffective before energization of the address. The address RAP__X is always "1" when it is ineffective, and RL1__is high when it is ineffective. On the other hand, CLNA__ is set low and the address is transmitted as CAP__X, and the column address can be used even before CL1__goes low. In this way, the device can operate in the enhance page mode, AS CLi__goes low, and the column address is latched to CAP__X. Finally, during the precharge cycle when RL1__goes high, XTTLADD converter is suppressed, and the influence of the external change address is avoided, while CAP__X is maintained.

Figure 23:
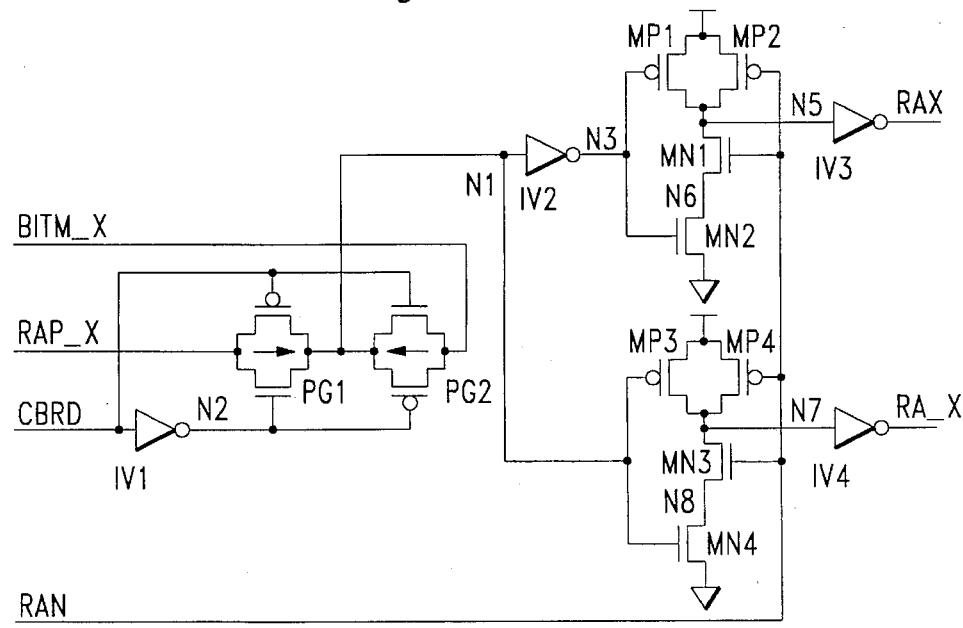
FIG. 23 is a circuit diagram of RADR (ROW ADDRESS DRIVER).

FIG. 23 shows the RADR (ROW ADDRESS DRIVER) circuit. This is a driver for the row address. Control signal RAN starts driving of the address signal. Instead of a simple driver, it also has the role of multiplexing the external latch row address and the CBR internal counter address before performing the drive operation.

Figure 24:
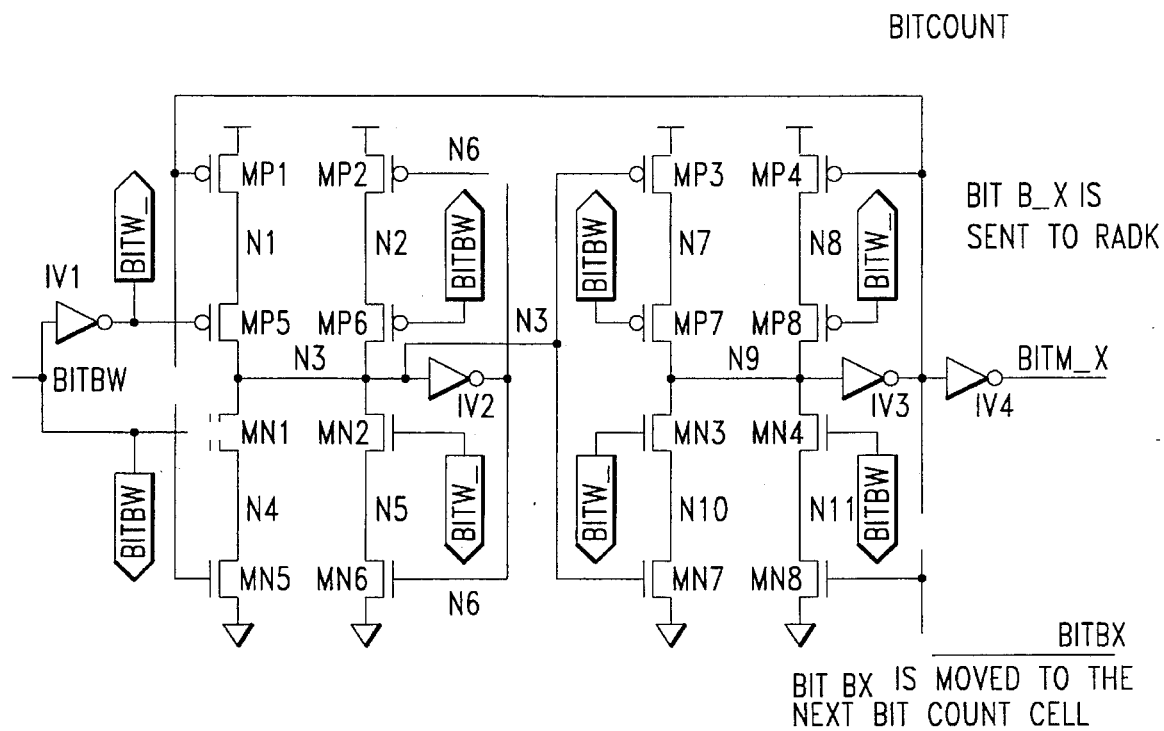
FIG. 24 is a circuit diagram of BITCOUNT (CBR INTERNAL BIT COUNTER ).

FIG. 24 shows BITCOUNT (CBR INTERNAL BITCOUNT) circuit. Twelve circuits of this type are connected in series inside the device. They act as the 12-bit internal address during the CBR cycle. The circuit is a flip-flop which is excited by the falling edge of the input signal. With respect to the least significant bit, the input is CRBD signal, and the output is LSB of CBR row address as well as the input of the BIT COUNT circuit of the next group. It is connected in series before the 12 CBR address lines are formed. This type of circuit performs the incremented binary counting operation on the basis of CBRD pulses.

Figure 25:
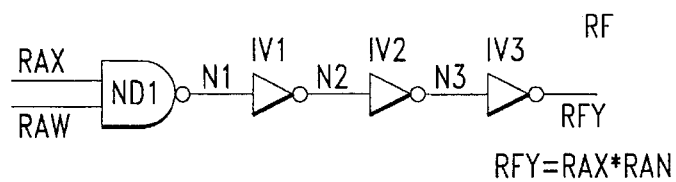
FIG. 25 is a circuit diagram of RF&RF (CODE ROW FACTOR).

FIG. 25 shows the RF&RF (CODE ROW FACTOR) circuit. The row factor is used for coding the row address to the form used by the subsequent row circuit. ROW addresses 2–7 and their complement are coded by means of "AND" operation, generating a 12-bit row factor.

Figure 26:
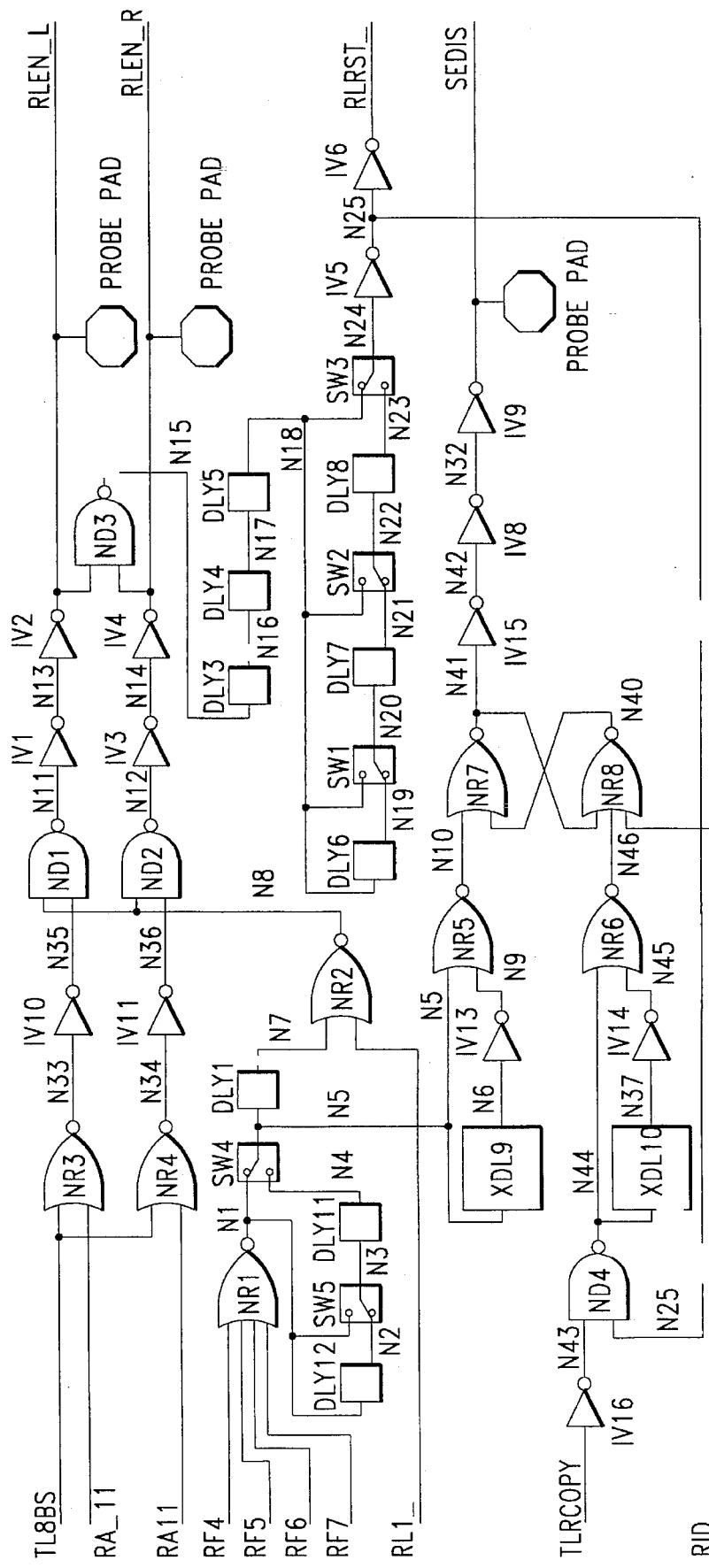
FIG. 26 is a circuit diagram of RLEN (ROW LOGIC ENABLE).
Figure 36:
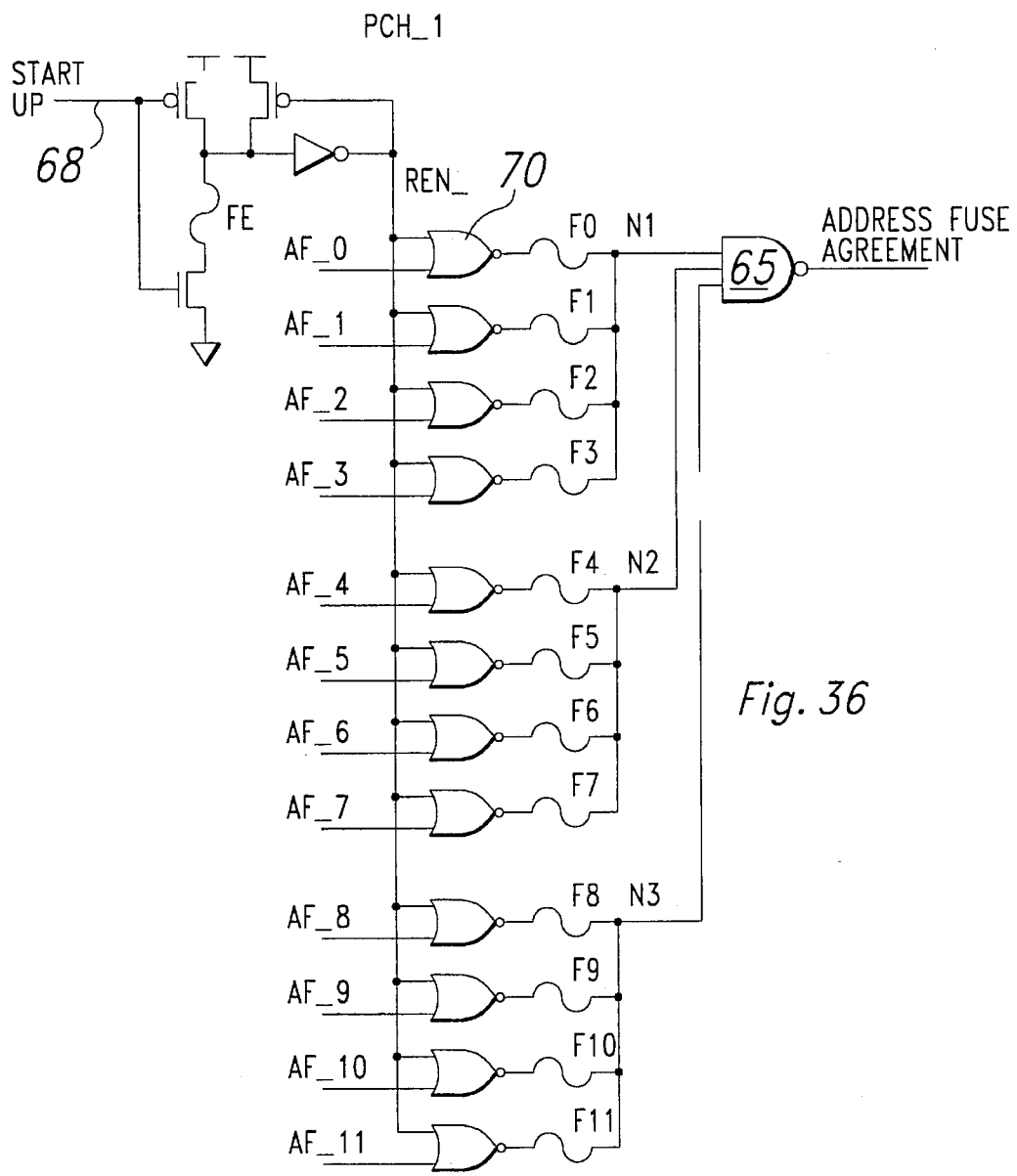
FIG. 36 is a circuit diagram of the fuse decoder of the redundant address coincidence circuit.

FIG. 26 shows the RLEN (ROW LOGIC ENABLE) circuit. The purpose of RLEN signal is to enable timing for the rising edge of RLXH, namely, the principal word line driver with respect to the row factor. In addition, RLEN circuit can generate RLRST__signal for indicating precharge and SEDIS for indicating the equalization process of BL to BL__. RLEN is usually known as row factor detector. It makes use of row factor RF4–RF7 to detect the end of the row factor encoding. When the end of encoding is detected, "NAND" gates ND1 and ND2 are energized, addresses RA11 and RA__11 are transmitted, and RLEN__R and RLEN__L are generated. These are signals that excite the principal word line driver and RLXH__R or RLXH__L, respectively. In standard operation, for the two drivers in a quadrant, only one is activated. However, in the DFT mode when there is a need to access all of the eight quadrants of the array at the same time, TLSBS is active high. In this way, RLEN__R and RLEN__L become active at the same time. Consequently, the principal word line driver, RLXH__R and RLXH__L all become active. When the row factor encoding is ended, the RLRST__state is set to the high logic level from the low logic level. On the other hand, after the end of the active cycle, upon arrival of the falling edge of RL1__, the RLRST__high logic level becomes the low logic level after a programmable delay. In this way, the start of another precharge cycle is indicated. The last element of the circuit is SENDING EQUALIZATION DISABLE, SEDS. As with RLRST__, they are used for indicating the stop and start of the equalization process from BL to BL__. However, only the row factor encoding which triggers the stop of the BL and BL__equalization process is used. This is because a large current is generated in the fuse decoder in the redundant address coincidence signal generator which decodes the row factor signal together with the redundant address, and it has an adverse influence on the reliability of the device. Consequently, the process stops 4 nsec after the end of row factor encoding. As far as the redundant address coincidence signal generating circuit as shown in FIG. 36 is concerned, this type of trouble does not occur. Then, when RLRST__has the low active state and the precharge cycle is started, SEDIS signal is delayed by 4 nsec and then reset to logic "0." In this way, the equalization process is started. When the device is in the ROW COPY DFT mode, in the initial cycle, state transition takes place for SEDIS from the low logic level to the high logic level, just as in any standard cycle. However, when the active cycle is ended, RLRST__has the low logic level; for the entire inactive cycle and the following cycle, SEID is prevented from becoming the high logic state. This is because of the active TLRCOPY which inactivates the reset signal from RLRST__. When there is no equalization process, the BL and BL__voltages are divided; in the DFT row copy operation, the data of BL or BL__are moved (dumped) to another row.

Figure 27:
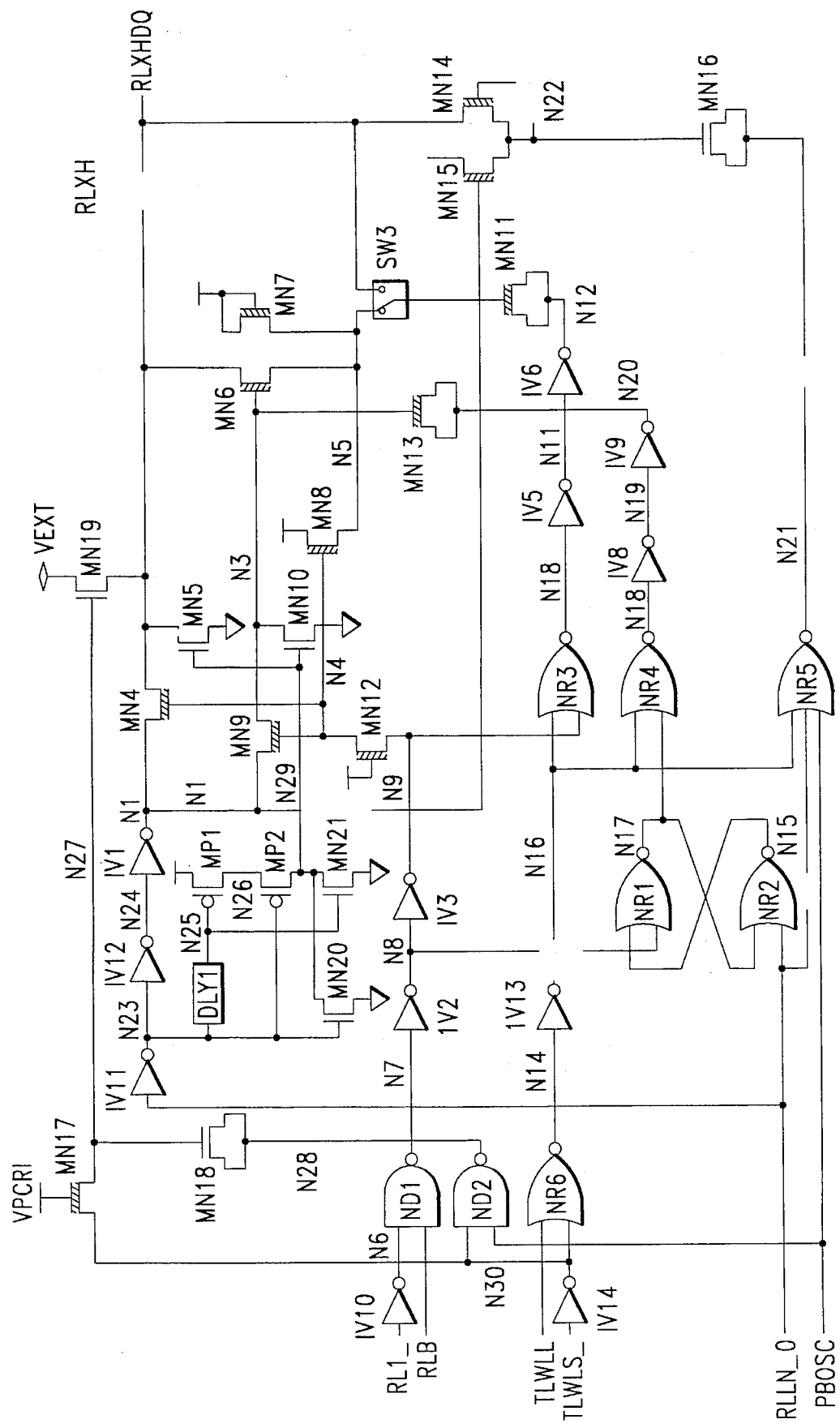
FIG. 27 is a circuit diagram of RLXH (ROW LOGIC X WORD HIGT).

FIG. 27 shows the RLXH (ROW LOGIC X WORD HIGT) circuit. Output RLXH is the low logic boosted line that drives the word line and the redundant word line. RLXH is also known as the principal word line driver. The circuit performs the following operations.

AT PRECHARGE: Node N4 is idled to (Vperi–Vt) by the invalid logic of RLl__and RLB. Then, boosting capacitor MN11 is charged to (Vperi–Vt) via MN7 and MN8. Node N3 of capacitor MN13 is set to the ground level. In addition, by means of transistor MN5, word line driver RLXH, which was set at the low logic level as RLEN__0, is set to the high logic level.

START OF AN ACTIVE CYCLE: Since RL1__has the low logic level, "NAND" gate ND1 can be prepared as a circuit which responds to RLB, ROW LOGIC BOOT signal.

COMPLETION OF FACTORS ENCODING: RLREN__0 becomes low active. By means of the high floating capacitance of n-channel transistor MN4 from node N1 to node N4, node N4 is boosted to (Vperi+Vperi–Vt). As RLEN__0 has low logic level, N1 has high logic level from the low logic level. As N4 is boosted, node N5 of capacitor MN11 is charged to Vperi. Node N3 of capacitor MN13 is charged to Vperi via MN9. In addition, transistors MN6 and MN4 are turned ON, and word line driver goes to Vperi, like node N1.

START OF DRIVER BOOTING: RLB goes high active. When transistor MN4 is shut off, and RLXH is insulated from node N1 and RLXH is fully boosted, the CMOS device at node N1 is protected. MN9 is also shut off with respect to the boosting of node N3. As RLB is activated, node N12 becomes logic 1. In this way, N5 is boosted to (Vperi+Vperi–Vt). At the same time when node 20 becomes logic 1, node N3 is boosted. In addition, the boosted voltage of capacitor MN11 is completely transferred to word line driver RLXH by boosted node N3. In this way, as the word line driver is boosted, the addressed row is driven.

END ACTIVE CYCLE: RL1__and RLEN__become invalid (high logic level). The boosted signal is released through MN10 and MN5. Just like point A__, the node is reset to the precharge state.

As explained in the above, in addition to the standard operation from AT PRECHARGE to END ACTIVE CYCLE, the PBOSC signal from the oscillator is excited in the LONG RAS cycle. This compensates for the leak in the word line due to the continuous boosting of RLHX in capacitor MN16. In the 2DFT mode, the word line driver's boosting function of the word line stress and the word line leak is inactivated by "NOR" gate NR3 and NR4. Transistor MN19 is turned ON in the word line stress mode, the boosting is inactivated, and an external voltage can be applied to the driver. As far as the word line leak mode is concerned, the boosting function is inactivated, and the leak test is the only test of the word line leak, without the boosting capacitor. The only disadvantage is that it is not a major inspection of the leakage. That is, since the word line is on the level of (Vperi−Vt), actually no high-voltage word line is present. During the period of any of these two DFT modes, the oscillation signal from PBOSC is inactivated via "NOR" gate NR5. In this way, it is able to prevent recharging of the word line through another source.

Figure 28:
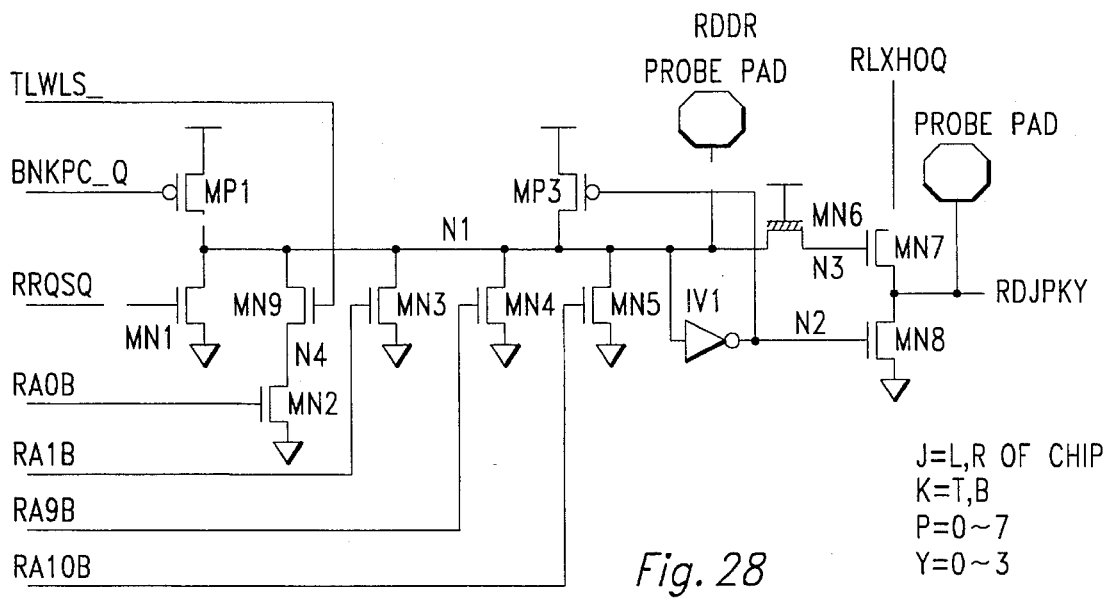
FIG. 28 is a circuit diagram of RDDR (ROW DECODER DRIVER).

FIG. 28 shows the RDDR (row decoder driver) circuit. It is the row predecoder of the device. Used in the initial address decoding, each predecoder gates the RLXH signal and selects one for each row with respect to the two 256K array block in each quadrant. The predecoder circuit comprises five "NOR" gates. The inputs used in predecoding include RA0, RA1, RA2, RA9 and RA10. The last input is RRQSQ, which is used to make the predecoder invalid in the case when the row is programmably redundant. In the case of precharging, BNKPC_Q is used when node N3 is charged. Inverter IV1 and transistor MP3 are used for maintaining node N3 at the high level when selection is performed, and RLXH drives the word line decoder. However, in the case when the device operates in the DFT word line stress mode, the low active TLWLS_signal makes the address decoding invalid on the base of RA0. In this way, it is possible to perform selection for the two adjacent rows.

Figure 29:
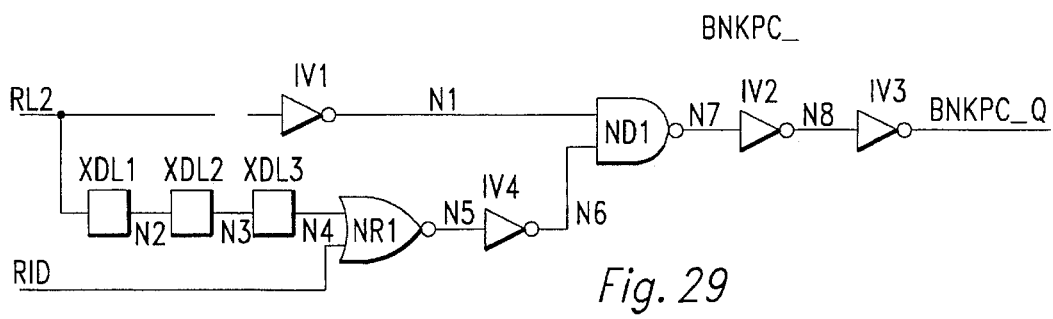
FIG. 29 is a circuit diagram of BNKPC_ (BANK SELECTION PRECHARGE CLOCK GENERATOR).

FIG. 29 shows the BNKPC_(bank selection precharge clock generator) circuit. It receives from reset pulse RID and RLT2 the clock stop [signal]. Its output signal BLKPC_Q excites row decoder driver RDDR, bank selection circuit BNKSL, the left bank selection circuit in FIG. 37, and the right bank selection circuit in FIG. 38.

Figure 30:
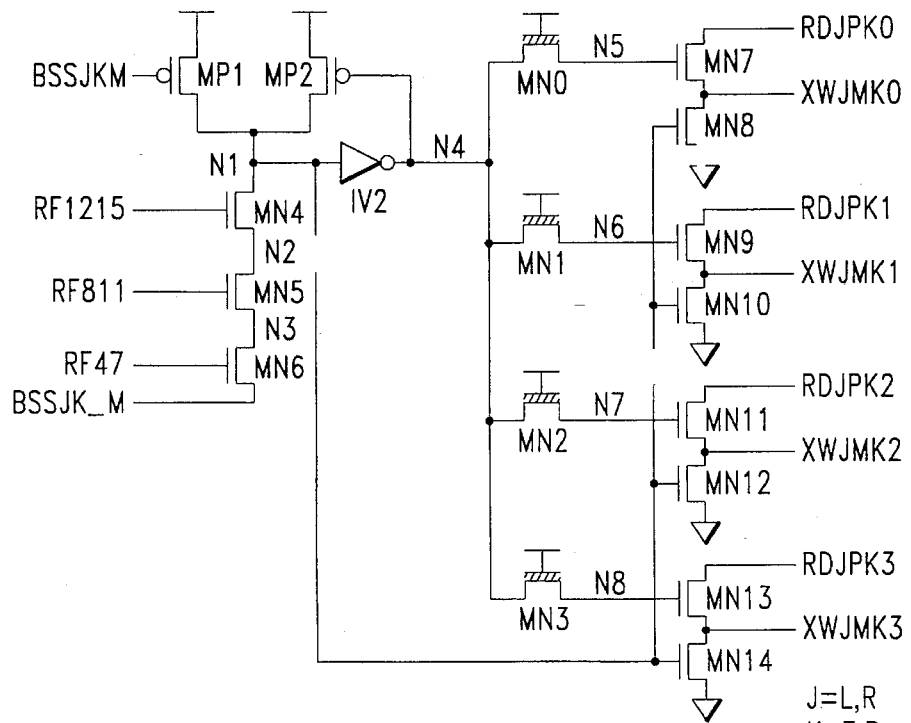
FIG. 30 is a circuit diagram of XDECM (ROW DECODER).

FIG. 30 shows XDECM (row: ROW decoder). The purpose of the row decoding is to perform the final decoding of the address and to select only the correct word line. That is, in the case when the address signal is received from a location remote from the decoder, the timing is delayed, and correct decoding is performed in the stage when all of the address bits are prepared. The row decoder makes use of the 3-input "NAND." The inputs include row factor, RF47, RF811, and RF1215. It selects one of the 64 group rows in each block of the 256K array. The source of "NAND" gate transistor is connected to block selection signal BSSJK_M. It is decoded by means of RA8-RA11. By setting it, only one of the active 256K array blocks having four word lines as a group is selected. The 4-word line set is XWJMK1, XWJMK1, XWJMK2, and XWJMK3. In the RDDR circuits, since they are already predecoded, only one of them is activated. BSSJMKM signal is used for precharging N1 to "1" and inverter IV2 and transistor MP2 are used for holding the signal when selection is performed. The purpose of the row redundant circuit is to replace the defective word line with the other standard word line for repair so as to ensure normal operation of the overall chip. In the quadrants of the 64M bits memory, there are 16 blocks of 512K bits array. Each of these blocks has four physically redundant word lines. The four redundant rows are all set at the most remote position from the sense amplifier of the 512K array, and each redundant word line can be used for replacing any defective row in the same block or defective row in other memory block or even other memory quadrant. Attention should be paid to the fact that there is no dummy word line that can limit the type of the row that can be replaced by the redundant row, that is, the row that can be replaced by BL or BL_row. As far as the programming of the redundancy is concerned, each quadrant is divided into two octant spaces of 8 blocks. With respect to any redundant rows programmed in an octant space, it is possible to program a similar redundancy to the image block of the other octant space. A feature of this circuit is that in the two octant spaces, for the DFT x32parallel and copy and other special modes for the operation of the array blocks, the necessity of having a complicated decoding circuit for identifying the octant space having the redundant row and the octant space having no redundant row is avoided: the two octant spaces are symmetrically programmed, and the surplus decoding circuit and fuse can be omitted. In addition, in order to increase the access speed, the RA11 address line is not decoded, and the access time of the redundant row is short compared to the decoding time of the RA11 address line. The device has 64 redundant decoders RRDEC. Within the chip, a total of 512 logic word lines can be interchanged. Each logic redundant line is made of a pair of two physical rows in each memory block. However, since there are only four physical redundant rows in each 512K memory block, the maximum number of rows that can be interchanged within the 512K memory block is only four. On the other hand, with the ANY TO ANY method, there is no such limitation, and the redundant row of the quadrant containing the redundant row can be used for replacing the defective row in the other quadrant. For the overall device, a total of 512 word lines can be interchanged, and there is no limitation on their positions. For example, as long as there exists unused redundant memory, correction can take place for all quadrants.

Figure 31:
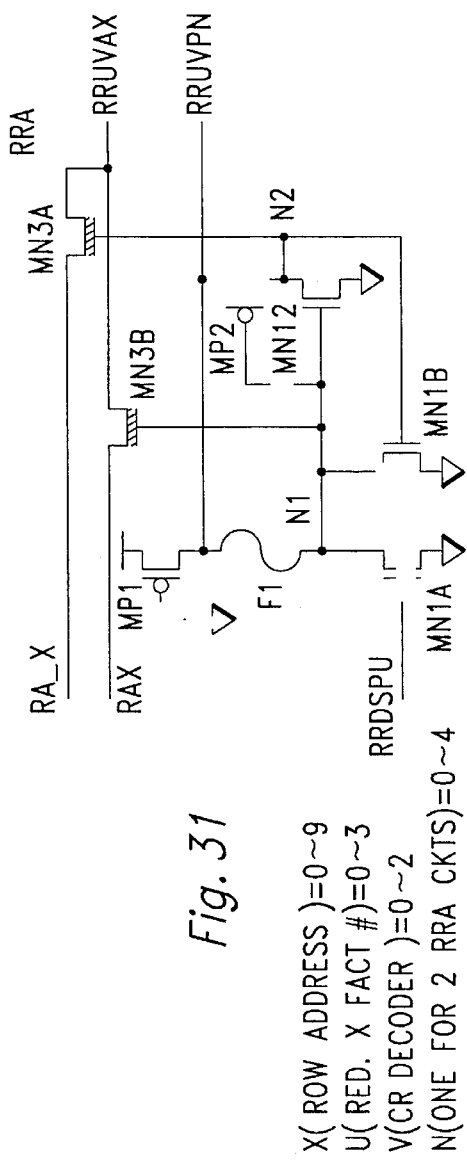
FIG. 31 is a circuit diagram of RRA (ROW REDUNDANCY ADDRESS).

FIG. 31 shows the RRA (ROW redundant address) circuit. It is used for generating the redundant address of the redundant decoder. In the device, there are 120 RRA circuit, which are divided into 12 groups, each of which has 10 RRA circuits. Row addresses RA0/RA_0 through RA9/RA_9 are used as the inputs to these groups. Each group represents the logic redundant row address. With respect to the programming of redundancy, when the address line is to take on logic "1," fuse F1 is blown, so that the redundant row address is programmed. On the other hand, when the redundant row is not used, F1 is not blown and left unchanged. During the operation cycle, the fuse is programmed; in this way, only when the input address during the operation cycle is in agreement with the redundant address, RRAoutput, and RRUVAX is set at logic "0." When the input address is not in agreement with the redundant address, RRUVAX gives an output of logic "1." Consequently, the redundant circuit is programmed as A72H row as the RRDSPU input pulse signal is set to the high level and the pulse latches the redundant address when the power source is turned on. In this case, for the purpose of programming, the 10 RRA circuits as a group make use of addresses RA0/RA_0 through RA9/RA_9. Care should be taken that addresses RA11 and RA10 are not used here. Since there is no need to select the octant space in each quadrant, RA11 can be ignored. Consequently, the chip can be used effectively. RA10 is decoded in the RRDEC circuit. Finally, there is node RRUVPN. This node acts as the power source line of the inverter having MP2 and MN2. It can prevent an excessive drop in the voltage of N1 when the power source is turned ON in the case when the fuse is not blown. As this signal is generated, it is difficult for MP1 to pull up node N1 as the limiter. Due to limitations imposed by the layout, the two RRA circuits share a transistor MP1 with a size of (W/2=20/0.8 μm), and the size of MP1 in the circuit is (W/1=10/0.8 μm). In this way, RRUVPN is merely a common node between two RRA circuits.

Figure 32:
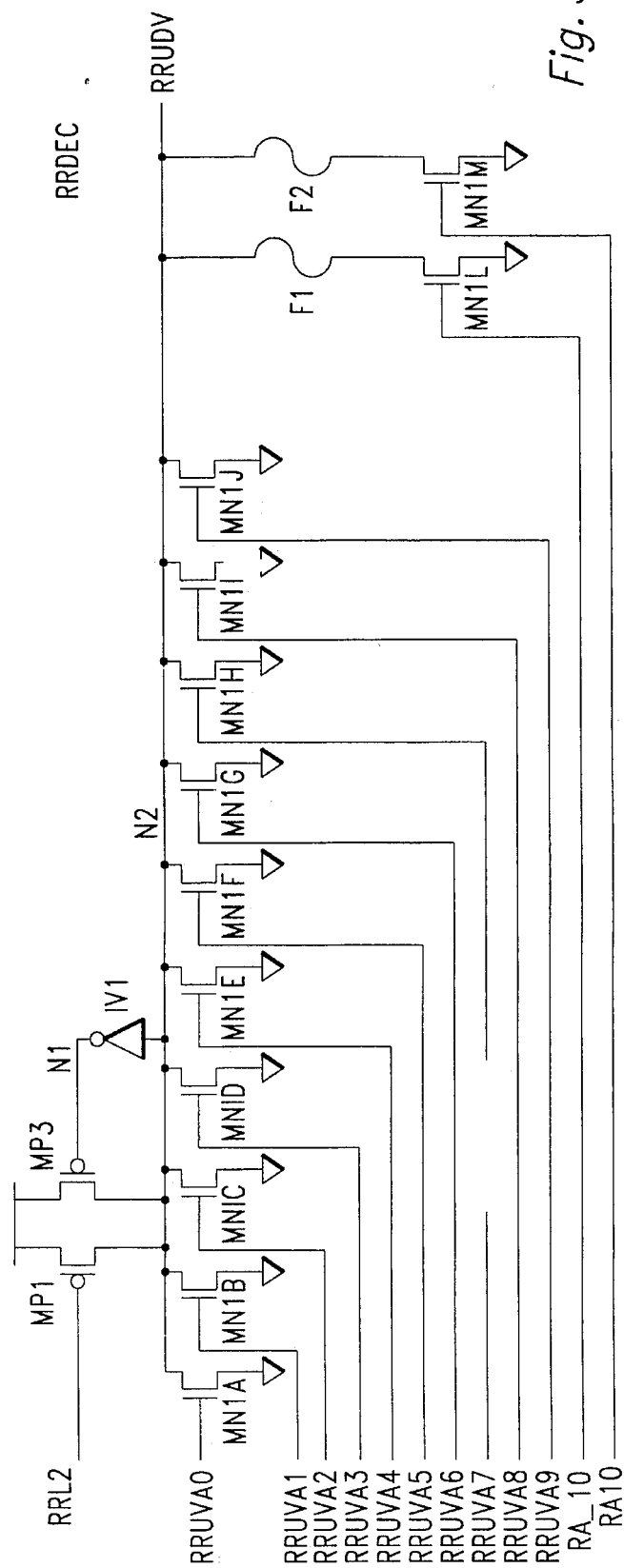
FIG. 32 is a circuit diagram of RRDEC (ROW REDUNDANCY DECODER).

FIG. 32 shows RRDEC (ROW redundant decoder). This circuit is used for decoding the redundant address generated by the RRA circuit and has the configuration of an integrated redundant mechanism. The outputs of 10 RRA as a group form the inputs of the decoder with a "NOR" configuration. The outputs of 10 RRA are generated from row addresses RA0/RA_0 through RA9/RA_9. In addition, RA10 and RA_10 are also connected as "NOR" inputs through two fuses. The fuses act as switches for energization of the circuit. At least one of them has to be blown to excite the circuit. In the case when the programmed redundant RA10 is set at logic "1," the fuse connected to input RA10 is blown. In the case of programming with logic "0," the other fuse is blown. In the case when neither fuse is blown, RRDEC remains invalid in any operation cycle. However, when both fuses are blown, the device ignores R10/R10_, and the two rows in the octant space can be selected at the same time. During the precharge, RRL2 switches transistor MP1 "ON," and the output is precharged to a high level. It is possible to set all of the input rows to invalid logic, and the flow of high current can be prevented. In the operation cycle, if address RA0/RA10 is in agreement with the programmed redundant address, the output remains on the high level, and it is able to indicate detection of a redundant row. It differs from the typical redundant decoder circuit using a single-stage "NOR" decoder in that a 2-stage decoding system is used. RRA is the predecoder, and RRDEC is used in the final decoding operation. While fuses are needed to correspond to the addresses of the real and complemented addresses entering the decoder in the conventional method this circuit can nevertheless reduce the number of fuses needed on the chip. Also, it is possible to reduce the capacitance of decoding node N2 so as to increase the decoding speed.

Figure 33:
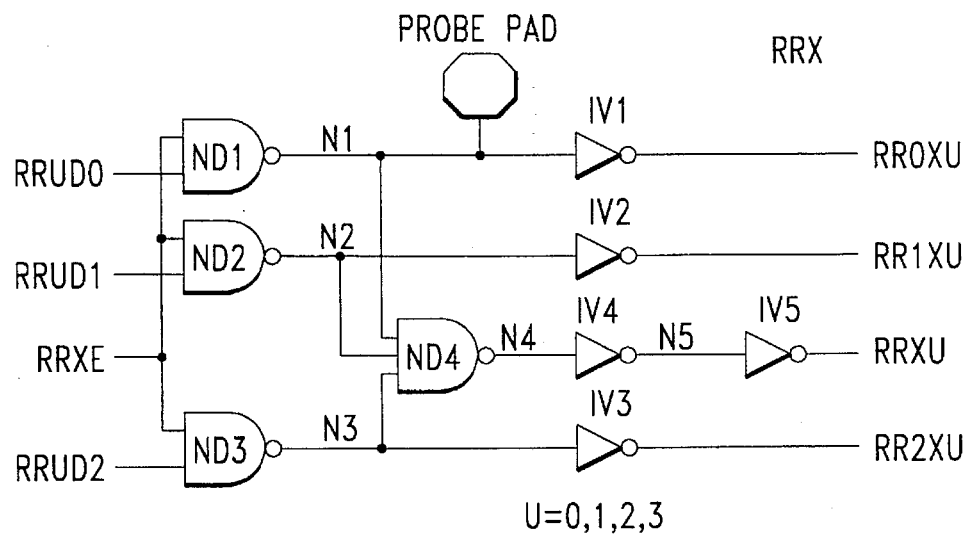
FIG. 33 is a circuit diagram of RRX (ROW REDUNDANCY X FACTOR).

FIG. 33 shows the RRX (ROW redundant X factor) circuit. There are eight such circuits in the DRAM. Each of them can make parallel selection of one of the four redundant rows in the 512K block together with three of the 12 RRDEC outputs. The output signal can be sent to the RRQS, the ROW redundant quadrant selection circuit. Three "NAND" gates can be energized by means of the RRXE signal. In this case, it is important to ensure that energization of the RRXE signal is initiated only in the case when the redundant decoding is ended, that is, after the nonselection RRUDV signal goes low. If the RRXE signal arrives too soon, in the interval between the rising edge of RRXE and the falling edge of the nonselection RRUVD signal, a high pulse is generated in output PROXU, RR1XU, or RR2VU. Due to the high pulse of these outputs, the RRQSQ signal is released, and it is unable to correctly determine which quadrant makes use of the redundancy. Another important feature of the RRXE gate timing is that it is necessary to switch off the gating as soon as possible after the operation cycle. This is for avoiding the high current in precharge with "NOR" gate RRQS decoder made invalid.

Figure 34:
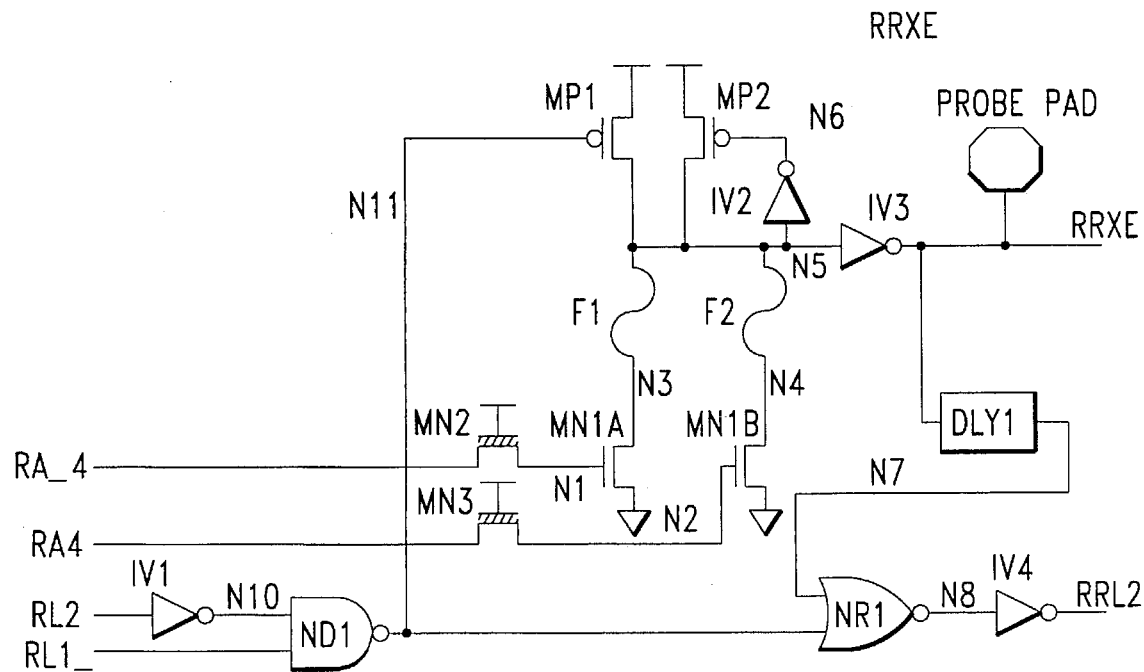
FIG. 34 is a circuit diagram of RRXE (ROW REDUNDANCY FACTOR EVALUATION).

FIG. 34 shows the RRXE (ROW redundant X factor evaluation) circuit. This RRXE circuit is designed to hamper the operation of the row redundant decoder in realizing the correct timing as in the aforementioned RRX circuit. In this way, gating of the RRX circuit can be realized by an appropriate RRXE signal sequence. In the RRXE circuit, RAO and RA_O are used for evaluating the address of the redundancy inside RRDEC and are used for precharging the circuit [sic]. P-channel transistor MP1 is much larger than the circuit of RRCED circuit. It delays switch-off and the start of RRXE, and provides a delay by means of inverter IV2. Since it is a large transistor, high speed pull-up is performed at node N2, and input of RRQS "NOR" gate is made invalid; hence, high current flow can be prevented. It is possible to generate agreement with the bus gate within RRA by using two bus gates MN2 and MN3. Since RL1_ and RL2 signals are gated at the same time and a precharge signal is sent to the gate of MP1, it is possible to realize the early switch-off of precharge by means of the falling edge of RL1_and the delayed turn-on of precharge by means of the falling edge of RL2. Finally, gated signals of RL1_and RL2 are gated by the delayed RRXE signal, and precharge signal RRL2 of the redundant circuit can be generated. In this way, before the other row redundant circuit performs precharge, interlock is performed for making the RRXE circuit to the precharge cycle. Consequently, in the precharge of the RRXE circuit, before start of precharge of these decoders by means of activation of RRL2, the various decoder inputs can be made invalid. As a result, it is a decoder having an active input, and there is no contradiction between the decoder input and the precharge cycle. If such a contradiction does takes place, a high current is extracted from within the decoder. In this case, since the two fuses are blown, it is possible to make the row redundant circuit invalid with respect to the overall device. Attention should be paid to this feature.

Figure 35:
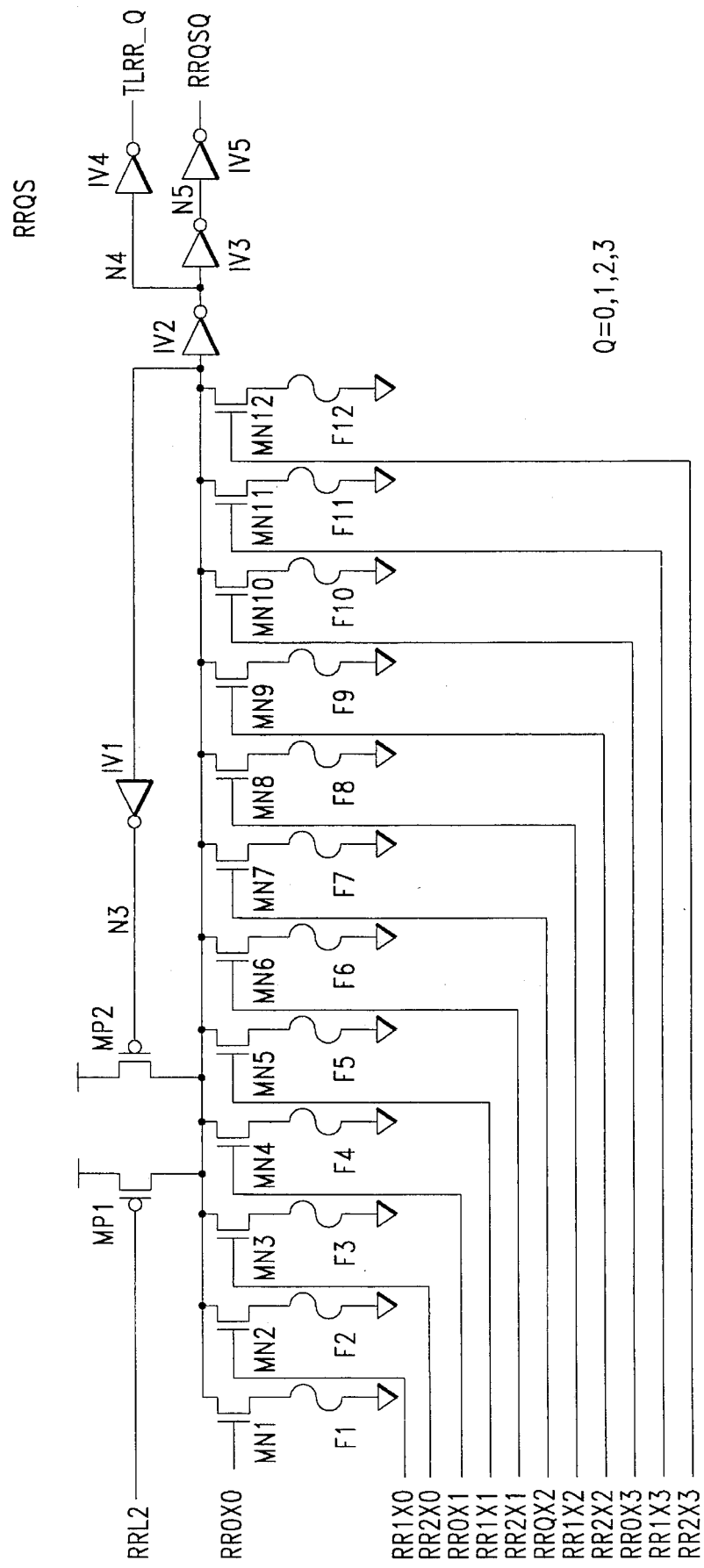
FIG. 35 is a circuit diagram of RRQS (ROW REDUNDANCY QUADRANT SELECTION).

FIG. 35 shows a RRQS (ROW redundant quadrant selection) circuit. While the aforementioned circuits can decode and identify the row address used for the redundancy, RRQS and quadrant selection further perform the decoding and identity the quadrant to which the redundant row belongs. The device has four such RRQS circuits, each of which can select the quadrant of the array. The RRQS circuit is designed as a "NOR" gate with 12 inputs. When this circuit is designed, if the redundant address does not belong to the repaired quadrant, the fuses corresponding to RRQS are blown. When the quadrant corresponds to the repaired row, the fuses are not blown. In this way, when the redundant row belongs to the quadrant, node N2 is always at the low level, and activated output RRQS signals, that is, TLRQ_and RRQSQ, are generated. In the case when the redundant row does not belong to the quadrant, or when what addressed is not a redundant row, node N2 remains at the high level. RRL2 signal is used for turning on MP1 during precharge and charging N2 to the high level. In the case when MP2 with an inverter is not selected, it is used for keeping the precharge level at node N2. Attention should be paid to the fact that by means of appropriate design, the redundant address can select any number of activated quadrants. This is realized by not blowing the fuse corresponding to the selected address in the RRQS circuit related to the quadrant having the repaired row. The fuses of RRQS circuit are able to ensure that when they are blown, the potential at node N1 is not discharged even when the predecoded address bit signal is applied to the gate of the transistor; on the other hand, when the fuses are not blown, since node N1 is discharged, the transistor makes the output of inverter IV2 high. However, since the address bit number can be 64M DRAM or larger, it is necessary to simultaneously decode the 13 bits in parallel. Consequently, the parallel equivalent resistance of the intrinsic resistances of the blown fuses is reduced. Consequently, for p-channel transistor MP1 which drives inverter IV2 via common node N1, when all of the address bits are at the high level and transistors MN1–MN12 are conducting, it must have a strong driving power for driving the parallel equivalent resistance of all of the fuses and inverter IV2. If the driving power is not high enough, the true coincidence signal cannot be generated and errors can occur. In particular, this risk is more probable when the power source is turned on and all of the address bits are set at the high level together with the reset signal. For fuse decoder circuit RRQS shown in FIG. 35, although transistor MP2 which pulls up common node N1 can be a small transistor as needed for maintaining the potential of node N1, as long as precharging cannot be performed again by the RRL2 signal, once the potential at common node N1 drops, the next cycle of redundant address decoding cannot be performed. Attention should be paid to this feature.

FIG. 36 shows the redundant address coincidence circuit. This is a circuit with improved operating speed and circuit area as compared to the redundant address coincidence circuits shown in FIGS. 31 and 32. When the redundant memory is to be used, it is only necessary to blow energization fuse FE. P-channel transistor PCH_1 can generate REN_ signal by means of being energized by start signal STARTUP68. In the former stage of this circuit, address signals AF_0 through AF11 with the input address adjusted to the low active signal and REN_ signal are operated logically by means of a "NOR" logic gate 70 to obtain the output signal. This signal is output to N1, N2, and N3 connected to wired "OR" through programmable fuses F0–F11. In addition, the output is input to "NAND" logic gate 65 to perform the logic operation, so as to obtain the address fuse coincidence signal. Consequently, it is judged that the device makes use of a redundant memory cell instead of a defective memory cell. In this case, each AF_signal is input to "NOR" gate 70. It is made of "NAND" gate, and, if "NAND" gate 65 is changed to "NOR" gate, the operating speed of the overall circuit can be further increased. Since four fuses are used as a group, if the fuse of F0 is left, the other fuses, that is, fuses F1, F2, F3, must be blown. The reason is that when the output of fuse F0 is at the high level, if the fuse of F1 is left, the signal is sent through F1 to the "NOR" gate output, and there is a danger of faulty logic operation or damage to the circuit. For each "NOR" gate 70, with the high resistance after blowing of the series connected fuse or the medium resistance due to incomplete blowing, "NAND" logic gate 65 of the next stage cannot be driven. Consequently, the address coincidence signal has high reliability. In addition, the fan-out of p-channel transistor PCH_1 is large. However, in the conventional operating state, the transistor may just have the conventional size for driving about 12 gates. In this case, N1, N2, N3 are the common nodes of the corresponding address decoders. However, it is also possible to perform wired connection for all of the addresses at one common node. In this case, "NAND" gate 65 in the last stage as shown in FIG. 36 should be changed to an inverter. For the decoder shown in FIG. 35, decoding of the redundant address cannot be performed until after common node N1 is precharged. However, there is no such limitation for the circuit of FIG. 36. That is, as long as the circuit is energized by the STARTUP signal, REN_ is activated. Consequently, when the transition takes place to the logic state of address signals AF_0 through AF_11, it is possible to generate the redundant address coincidence signal for the new cycle. Attention should be paid to the fact that this is effective for high-speed access of the static column mode, etc.

Figure 37:
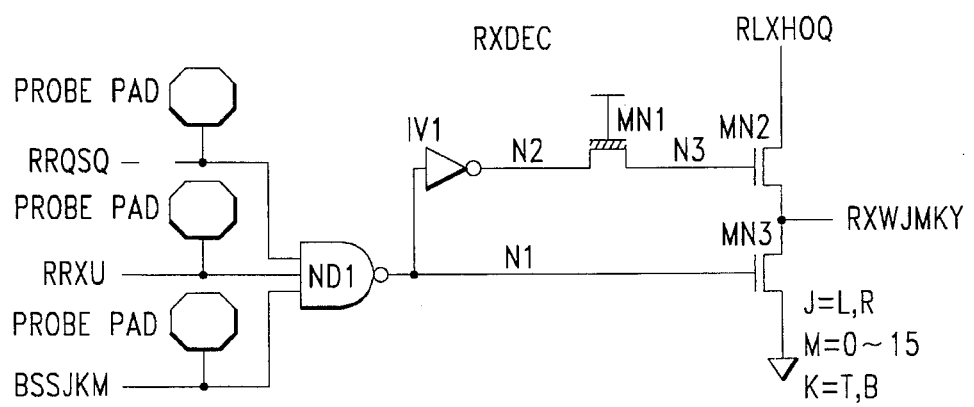
FIG. 37 is a circuit diagram of RXDEC (REDUNDANCY X WORD DECODER).

FIG. 37 shows the RXDEC (redundant X word decoder) circuit. For the RXDEC circuit used as the last decoding of the redundant row, a voltage level boosted from the word line driver to the redundant row is transmitted. The various physical redundant rows are generated by the RXDEC circuit. The redundancy decoding is performed by means of the 3-input "NAND" gate. From the given redundant address, RRQSQ identifies the quadrant, and RRXU decodes one of the four redundant rows in each 256K array block. Finally, the standard row decoding is performed, block signal BSSJKM selects one of the 16 array blocks, and the row redundancy decoding is ended.

Figures 38, 39:
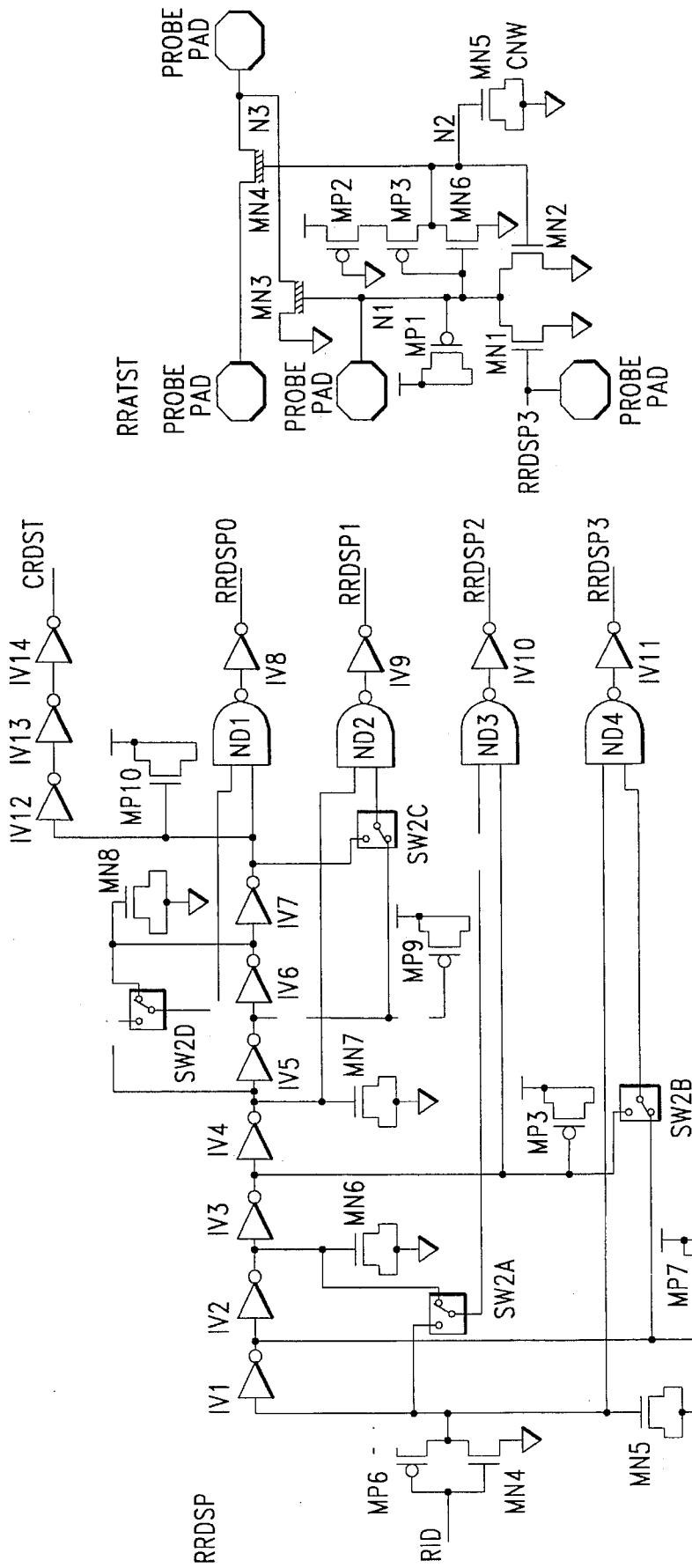
FIG. 38 is a circuit diagram of RRDSP (ROW REDUNDANCY DECODER SET SIGNAL).
FIG. 39 is a circuit diagram of RRATST.
Figures 38, 39:
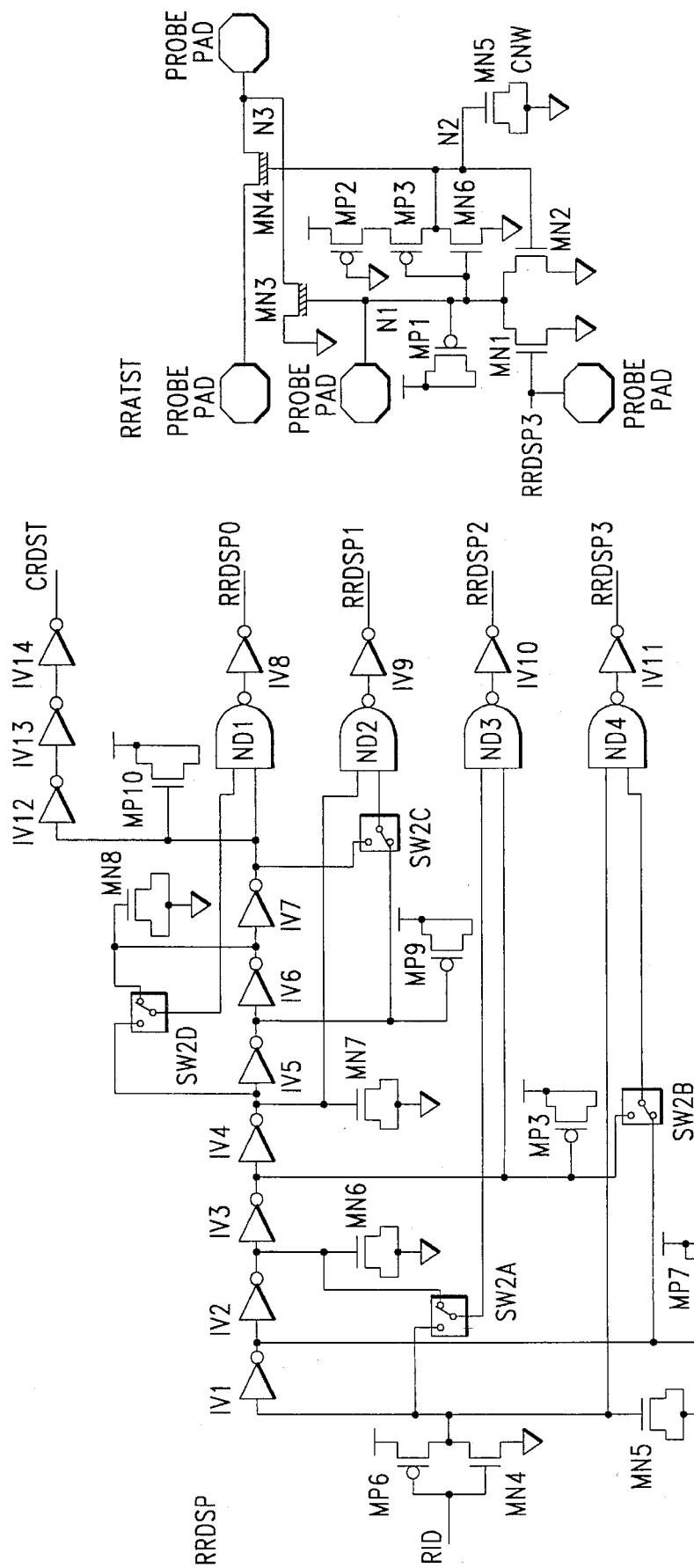

FIG. 38 shows the RRDSP (ROW redundancy decoder set signal) circuit. The purpose of this circuit is to generate pulses in the RRA and CRRA circuits and to generate the redundant address when the power source is turned on. AS a sequence of connected inverters and capacitors, the input/output stages of these inverters are gated by means of the "NAND" gate to provide pulses. By using RID as the input, the circuit is excited when the power source is turned on. In this case, instead of generation of one pulse for all of the RRA circuits, four pulses are generated at different times by means of 120 RRA circuit. Consequently, it is possible to avoid the simultaneous excitation of all of the RRA circuits, which is a reason for the high peak current, and the problems of noise, etc., can be avoided. In addition, by changing the metal mask of SW2A, SW2B, SW2C, SW2D, the pulse widths of RRDSP0, which has RRDSP1, and RRSDSP2, which has RRDSP3, are combined to generate two groups of pulses instead of four groups of pulses. After pulses are generated, the output CRDST is excited. In this way, the pulse output is started for performing the column redundant address latch in the CRDSP circuit.

FIG. 39 shows the RRATST circuit. The purpose of this circuit is to check whether the pulses generated by RRDSP are sufficient in latching the RRA address. It makes use of only the internal probing. RRATST is identical to RRA except that the fuse used in RRA is replaced in this case by capacitor MP1. Instead of using a standard input, the probe pad for the external signal is set on RA_X, and [it is]grounded for RAX input. Another probe pad is connected in parallel to the RRDSPU signal. In this way, it is possible to latch the signals alternately. Capacitor MN5 sets node N2 to the low level at the time the power source is turned on. This circuit is able to check whether the RDSPU pulse width is sufficient for discharging node N1 of capacitor MP1. The state can be monitored by the probe pad at nodes N1 and N3. For the sense clock which performs the operation chain of the sensing sequence of the data in the device, excitation takes place each time when the address decoding performed within the cycle of any operation is ended. This is accompanied with generation of various clocks to ensure the ON state of the selected sense amplifiers. Before entering each sense clock circuit, a survey is performed for the sense amplifier circuit of the 64M memory. First, the quadrant is divided to 16 blocks of 512K memory arrays. Eight bank-structured sense amplifiers are set in one quadrant. These sense amplifiers are set in parallel to the central bonding pad and are located side by side from the central side to the chip side. In order to reduce the used area of the chip to a minimum, the 64M DRAM is designed with the common sense amplifier. In the common sense amplifier circuit, each sense amplifier bank is shared by two 512 Kb memory array blocks. That is, it is possible to sense 1 Mb. Consequently, no sense amplifier bank is present at the two ends of each quadrant. Attention should be paid to this feature. Each sense amplifier bank has 256 sense amplifiers. Consequently, each bank takes care of the 256 columns of the memory arrays on its two sides. A prominent feature of this circuit is that the two columns taken care of by the same sense amplifier do not have the same Y address, that is, one of them has an odd number address, while the other has an even number address. Consequently, its switching can be performed by selecting the YS line which traverses vertically through the sense amplifier.

Just as in the case of the row redundancy, the configuration of the column redundancy has the purpose to form a chip that can replace the defective column so as to ensure perfect operation. In the chip, the memory array is divided into 8 quadrants. Each quadrant has 16 array blocks with 256 columns. Each array block has 6 redundant columns. These redundant columns can be set on the two sides facing the center. The redundant column is made of a pair of bit lines BL and BL_ and a sense amplifier. Different from the row redundant circuit in which the redundant row can be used to replace any defective row, the repair by the column redundancy is performed under control of the data passage of the defective column. Each array block is supported by two sense amplifier banks. Each of these banks has two local I/O data passages with respect to two different main I/O lines. Consequently, the redundant column with the same main I/O line with respect to repair is used.

The redundant column array has the same form as the block array. The redundant sense amplifier bank is an extension of the conventional sense amplifier bank. Each of these banks has 6 redundant sense amplifiers. In addition, the initial three sense amplifiers are connected to the even-numbered main I/O, while the other three sense amplifiers are connected to the odd-numbered main I/O. With respect to repair by redundancy, it is necessary to first find out which sense amplifier is connected to the defective column. As soon as the defective column having the defective portion and the sense amplifier are identified, they are replaced by the redundant column which has the same main I/O as the sense amplifier.

In redundant programming, it is necessary to replace the two columns adjacent to each defective column in the array block. The two columns have the common column address CA11-CA1. At the same time, the other column with the same address in the next octant space is replaced. The reason for performing repair for two octant spaces at the same time is the same as that in the case of the row redundant circuit. In addition to repair of two columns at the same time, as an option, it is possible to replace the adjacent four columns of columns CA11-CA2 having the same redundant decoder. Also, there is the so-called ANY TO ANY option in which several quadrants perform the replacement operation by using the same redundant decoder.

There is the following limitation on the replacement of several columns. The 64 redundant decoders allows only replacement of 64 logic columns; although there are 64 physical redundant columns in each array block, each round of repair uses at least two columns; hence, each array block allows only three redundancies. In addition, each bank has six redundant sense amplifiers, among which three are connected to the even-numbered main I/O, while the other three are connected to the odd-numbered main I/O. In this way, the number of replacement by the same main I/O is limited to 3. In addition, for repair of the columns with the same address from different blocks, in the case when the same RA8-RA9 address is not shared, it is necessary to add the redundant decoders independently.

In the above, this invention has been explained in detail with reference to embodiments. However, these embodiments are only presented as examples, they do not have any defining function. In addition, the details may be amended at many points by experts in the field with reference to the above explanation. For example, in the above, this invention was explained with reference to the DRAM. However, the method of this invention may also be used as the redundant configuration for other types of memory containing read-only memory (ROM) and static random access memory (SRAM). In addition, the n-channel transistors can be replaced by the p-channel transistors, and the field-effect transistors may be replaced by bipolar transistors. The field-effect transistors referred to here may be the MOS transistors. Their configuration can be formed on an IC by using conventional semiconductor manufacturing technology. All of these changes and other changes are contained in the technical ideas of the claims of this invention.

The effects of the invention can be summarized briefly as follows:

(1) Many electrical circuits can be formed in the semiconductor IC chip.

(2) The defective memory cells generated in the semiconductor IC manufactured using submicron technology can be replaced by the redundant memory cells programmable by the blowing of fuses.

(3) It can provide a memory cell redundant mechanism which can be used to repair the defective memory cells and defective row lines due to short-circuiting in all of the memory quadrants free of errors at a high speed.

(4) It can provide an address coincident signal generation circuit operated by a low consumption of power and with a low manufacturing cost.

(5) It can provide a type of semiconductor IC with an improved manufacturing yield.

We claim:

1. A semiconductor memory device comprising:

a plurality of arrays of memory cells;

each of said arrays of memory cells being arranged in a matrix of rows and columns of individual memory cells;

multiple redundant memory cells for replacement of defective memory cells included in said matrix of rows and columns of individual memory cells for each array of memory cells, said multiple redundant memory cells being arranged in respective groups of one of redundant rows and columns with each said one of redundant-rows and columns included in a group having a plurality of redundant memory cells;

address generating means for providing a memory address signal to selectively drive one of the row and column of memory cells included in an array of memory cells;

multiple programmable fuses having respective input means, each of the input means of said programmable fuses being connected to said address generating means for receiving the memory address signal;

an electrical connection node common to each of said fuses;

each of said fuses having an output connected to said common node;

address coincidence signal generating means connected to said common node and generating an address coincidence signal in response to outputs received and indicative of a specific defective memory cell, said address coincidence signal generating means including, transistor means having a first output and a second output complementary to the first output, said first and second outputs of said transistor means being coupled to a single transistor output node, said transistor means being programmable to activate the use of redundant memory cells, a plurality of logic gates each including a programmable fuse disposed at the output thereof, each of said logic gates having first and second inputs, the first input of each of said logic gates being connected to said output node of said transistor means, the second input of each of said logic gates receiving a different one of a plurality of memory address bits for identifying the address of a memory cell, said electrical connection node being common to each of said logic gates included in said plurality of logic gates, and the output including the programmable fuse of each of said logic gates being connected to said common node to provide a composite output as an address coincidence signal indicative of a specific defective memory cell for replacement by a redundant memory cell; and means connected to said address coincidence signal generating means for accessing said multiple redundant memory cells and replacing said specific defective memory cell of a memory cell array with a redundant memory cell from said multiple redundant memory cells in response to receiving the address coincidence signal from said address coincidence signal generating means;

the replacement of a specific defective memory cell of a memory cell array with a redundant memory cell being accomplished by said means connected to said address coincidence signal generating means accessing one of the said one of redundant rows and columns from any of said groups and replacing a corresponding one of rows and columns of memory cells in which said specific defective memory cell occurs with the accessed said one of redundant rows and columns of redundant memory cells.

2. A semiconductor memory device as set forth in claim 1, wherein said transistor means includes a first field effect transistor having a control gate and having an output providing the first output of said transistor means coupled to the output node thereof;

a programmable fuse connected to the first output of said transistor means and to ground for rendering said address coincidence signal generating means inactive; and said address coincidence signal generating means being enabled in response to blowing the fuse connected to the first output of said transistor means.

3. A semiconductor memory device as set forth in claim 2, wherein said address coincidence signal generating means further includes a control transistor having a control gate and connected between said programmable fuse at the first output of said transistor means and ground; and said transistor means and said control transistor being rendered conductive in response to a start signal received by the control gates thereof.

4. A semiconductor memory device as set forth in claim 1, wherein said plurality of logic gates are arranged in respective logic gate arrays each having a plurality of logic gates;

a plurality of nodes corresponding in number to the number of logic gate arrays, each of said logic gate arrays having a plurality of outputs connected to the node common thereto to provide respective composite outputs corresponding in number to the number of logic gate arrays;

an output logic gate having a plurality of inputs respectively corresponding in number to the plurality of composite outputs from the logic gate arrays and connected thereto; and said output logic gate having an output for providing the address coincidence signal indicative of a specific defective memory cell.

5. A semiconductor memory device as set forth in claim 4, wherein said plurality of logic gates are NOR logic gates.

6. A semiconductor memory device as set forth in claim 5, wherein the output logic gate is a NAND logic gate.

* * * * *